United States Patent [19]
Tyler et al.

[11] Patent Number: 5,638,498
[45] Date of Patent: Jun. 10, 1997

[54] METHOD AND APPARATUS FOR REDUCING STORAGE REQUIREMENTS FOR DISPLAY DATA

[75] Inventors: William B. Tyler, Carmel; Nicholas J. Foskett, Mountain View; Soon Y. Kong, Cupertino; Richard N. Fall, Palo Alto; Ronald S. Gentile, Atherton, all of Calif.

[73] Assignee: Adobe Systems Incorporated, San Jose, Calif.

[21] Appl. No.: 484,344

[22] Filed: Jun. 7, 1995

Related U.S. Application Data

[63] Continuation-in-part of Ser. No. 974,204, Nov. 10, 1992.

[51] Int. Cl.$^6$ ..................................................... G06K 15/00
[52] U.S. Cl. ............................................. 395/117; 395/115
[58] Field of Search ........................... 395/114, 112, 395/115, 116, 117, 509, 520, 521, 523; 382/232, 233, 235, 236; 358/450, 444, 540, 426, 261.3, 261.4, 432, 433

[56] References Cited

U.S. PATENT DOCUMENTS

| | | | |
|---|---|---|---|
| 5,034,804 | 7/1991 | Sasaki et al. | 358/41 |
| 5,150,454 | 9/1992 | Wood et al. | 395/114 |
| 5,151,949 | 9/1992 | Miyata | 382/56 |
| 5,199,803 | 4/1993 | Shimizu et al. | 400/121 |
| 5,207,517 | 5/1993 | Ito | 400/121 |
| 5,208,676 | 5/1993 | Inui | 358/296 |
| 5,241,397 | 8/1993 | Yamada | 358/296 |
| 5,270,728 | 12/1993 | Lund et al. | 346/1.1 |
| 5,272,768 | 12/1993 | Bauman et al. | 395/110 |
| 5,276,780 | 1/1994 | Sugiura | 395/116 |
| 5,295,233 | 3/1994 | Ota | 395/115 |
| 5,299,292 | 3/1994 | Kadowaki et al. | 395/108 |
| 5,347,368 | 9/1994 | Mochizuki | 358/296 |
| 5,354,135 | 10/1994 | Sakagami et al. | 400/124 |
| 5,355,441 | 10/1994 | Kawai et al. | 395/115 |
| 5,374,943 | 12/1994 | Lehmann et al. | 347/9 |
| 5,377,312 | 12/1994 | Kobayashi | 395/116 |

FOREIGN PATENT DOCUMENTS

| | | | |
|---|---|---|---|
| 0320014A2 | 6/1989 | European Pat. Off. | 15/72 |
| 0475601A2 | 3/1992 | European Pat. Off. | 15/72 |
| 0475601A3 | 3/1992 | European Pat. Off. | 15/72 |

OTHER PUBLICATIONS

Okada, Yoshiyuki et al., "Adaptive Coding for Text and Dithered Continuous-Tone Images,", Fujitsu Sci. Tech, Jun. 1987, pp. 101–109.

Mintzer, Fred, "Integrating Image Into Computers for Publishing, " IEEE, Conference Record vol. 2, Nov. 15–18, 1987, pp. 19.6.1–19.6.4.

*Primary Examiner*—Arthur G. Evans
*Attorney, Agent, or Firm*—Fish & Richardson P.C.

[57] ABSTRACT

A method and apparatus for reducing storage requirements for display data on a computer system. Data objects to be displayed are organized into display lists and each data object includes an object type, such as text, graphic, and image. The data objects are rasterized into an uncompressed band buffer and divided into non-intersecting bitmap regions each identified with one or more object types. Each non-empty region is assigned a compression algorithm dependent upon the type of the region and specified compression constraints. The regions are combined with each other into larger regions if appropriate, and each region is compressed using its assigned compression algorithm into a compressed band buffer, thus reducing the required storage space for the data objects. The compressed data is decompressed in scan line order with a selected decompression algorithm corresponding to the assigned compression algorithms to produce uncompressed output data. The uncompressed output data is supplied to an output display device for display.

60 Claims, 18 Drawing Sheets

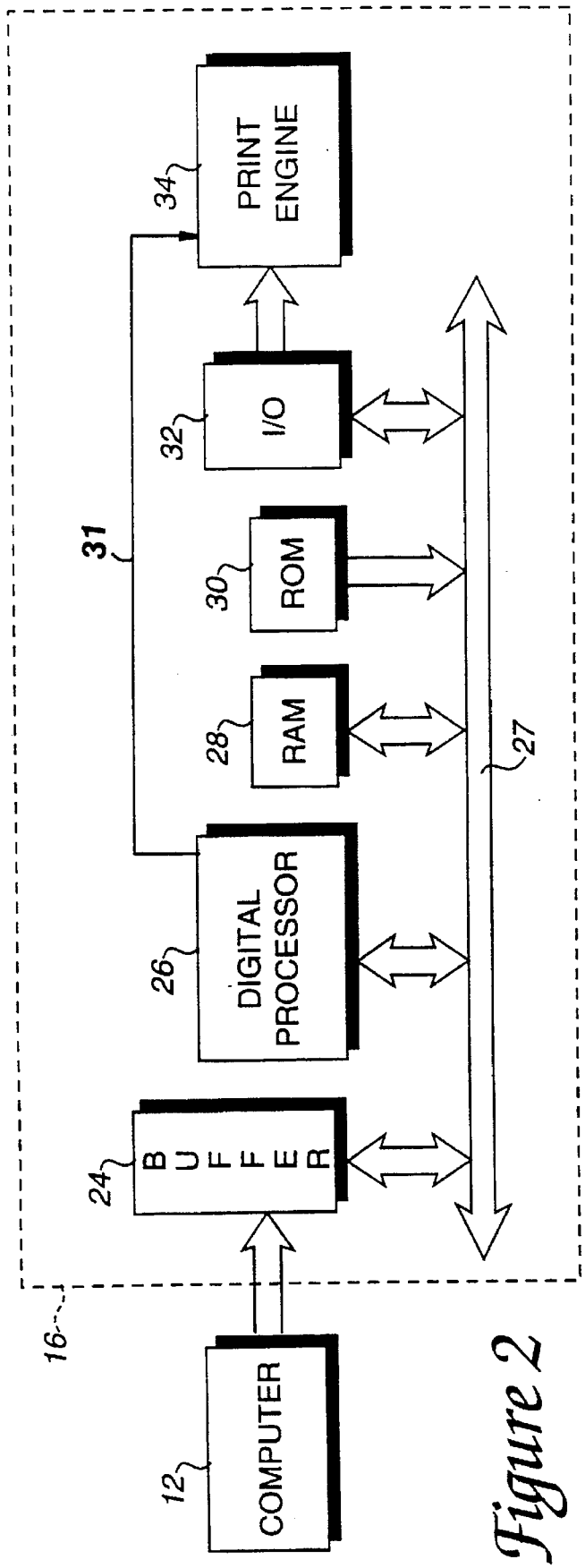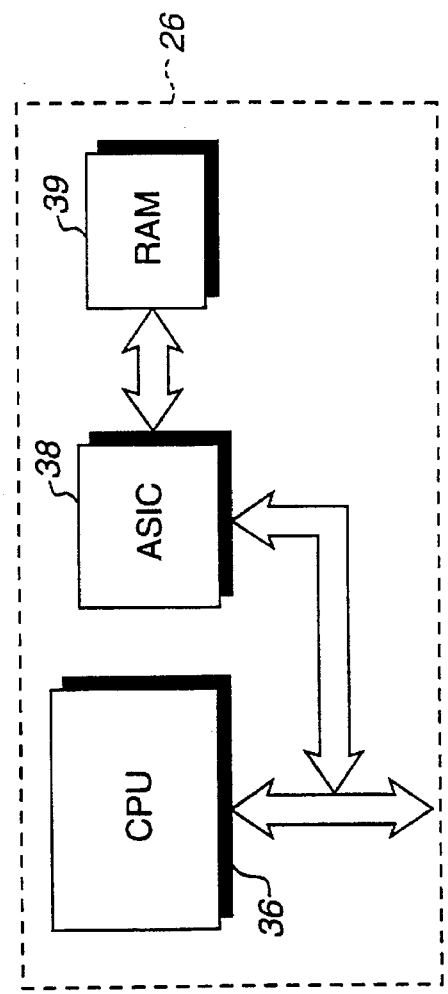
Figure 2
Figure 2a

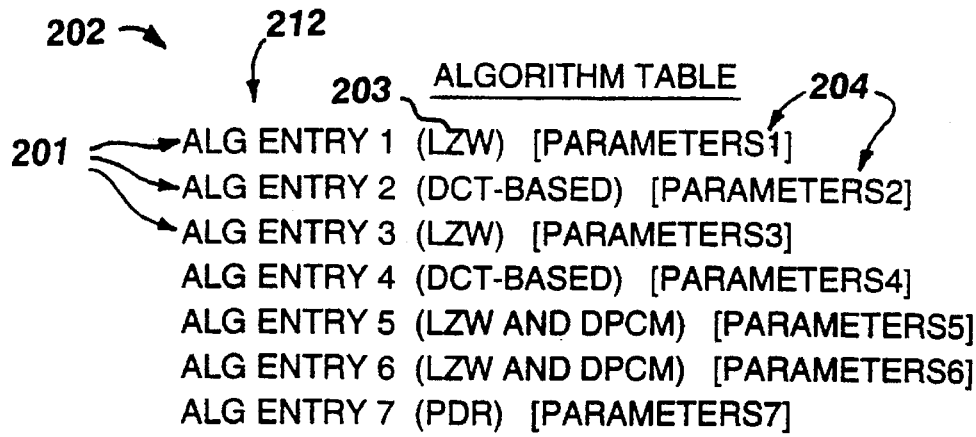

```
                                  212
        202                      ↙
                        203     ALGORITHM TABLE        204
    201    →ALG ENTRY 1  (LZW)   [PARAMETERS1]
           →ALG ENTRY 2  (DCT-BASED)   [PARAMETERS2]
           →ALG ENTRY 3  (LZW)   [PARAMETERS3]
            ALG ENTRY 4  (DCT-BASED)   [PARAMETERS4]
            ALG ENTRY 5  (LZW AND DPCM)   [PARAMETERS5]
            ALG ENTRY 6  (LZW AND DPCM)   [PARAMETERS6]
            ALG ENTRY 7  (PDR)   [PARAMETERS7]
```

*Figure 8a*

INDEXING TABLE

| TEXT | IMAGE | GRAPHIC | |
|---|---|---|---|
| NO  | NO  | NO  | (NO ALGORITHM ASSIGNED) |
| YES | NO  | NO  | (Q = 0, CR = 2.0, ALG ENTRY 1) |
|     |     |     | (Q = 2, CR = 5.0, ALG ENTRY 3) |
|     |     |     | (Q = 4, CR = 10.0, ALG ENTRY 5) |
| NO  | NO  | YES | (Q = 0, CR = 2.0, ALG ENTRY 1) |
|     |     |     | (Q = 0, CR = 3.0, ALG ENTRY 3) |
|     |     |     | (Q = 4, CR = 8.0, ALG ENTRY 6) |
| NO  | YES | NO  | (Q = 0, CR = 4.0, ALG ENTRY 2) |
|     |     |     | (Q = 1, CR = 7.0, ALG ENTRY 4) |
|     |     |     | (Q = 3, CR = 9.0, ALG ENTRY 5) |
| YES | NO  | YES | (Q = 0, CR = 2.0, ALG ENTRY 1) |
|     |     |     | (Q = 3, CR = 5.0, ALG ENTRY 5) |
|     |     |     | (Q = 5, CR = 6.0, ALG ENTRY 6) |
| NO  | YES | YES | (Q = 0, CR = 2.0, ALG ENTRY 6) |
|     |     |     | (Q = 2, CR = 2.5, ALG ENTRY 2) |
|     |     |     | (Q = 3, CR = 5.0, ALG ENTRY 7) |
| YES | YES | NO  | (Q = 0, CR = 2.0, ALG ENTRY 6) |
|     |     |     | (Q = 1, CR = 3.0, ALG ENTRY 5) |
|     |     |     | (Q = 4, CR = 4.5, ALG ENTRY 2) |
| YES | YES | YES | (Q = 0, CR = 1.5, ALG ENTRY 5) |
|     |     |     | (Q = 2, CR = 2.0, ALG ENTRY 4) |

*Figure 8b*

METHOD AND APPARATUS FOR REDUCING STORAGE REQUIREMENTS FOR DISPLAY DATA

CROSS REFERENCE TO RELATED APPLICATIONS

This application is a continuation-in-part of co-pending parent patent application 07/974,204, filed Nov. 10, 1992 on behalf of Ronald S. Gentile, entitled, "Method and Apparatus for Processing Data for a Visual-Output Device with Reduced Buffer Memory Requirements," assigned to the assignee of this present application, and which is incorporated by reference herein.

BACKGROUND OF THE INVENTION

The present invention relates generally to the display of data by output devices, and more particularly to a method and apparatus for reducing memory storage requirements when displaying data on an output display device.

A computer system can output data to a wide variety of output display devices. Output display devices such as laser printers, plotters, and other printing devices produce an image or "visual representation" onto a sheet of paper or the like, while output display devices such as computer monitors develop visual representations on a computer screen.

Many output display devices receive display data in the form of a "bitmap" or "pixel map" and generate visual representations from the display data. A pixel is a fundamental picture element of a visual representation generated by a display device, and a bitmap is a data structure including information concerning a number of pixels of the representation. Bitmaps that contain more than on/off information are often referred to as "pixel maps." As used herein, both bitmaps and pixel maps are referred to as "bitmaps."

A printer can print dots on a piece of paper corresponding to the information of a bitmap. Alternatively, a computer monitor can illuminate pixels based upon the information of the bitmap. A "raster" output device creates a visual representation by displaying the array of pixels arranged in rows and columns from the bitmap. Most output devices, other than plotters, are raster output devices. Typically, a "page" of pixels corresponding to a printed or displayed page is received and stored in memory before the pixels are displayed by the output display device.

A visual representation can contain a number of image types, including text, graphics, photographic images, etc. Data of these types can be efficiently stored in files with other image information as high level "objects." An "object", as referred to herein, is the data and attributes defining a particular visual representation. The objects can be edited or otherwise manipulated using an application program ("software") running on a computer. When displaying the objects with an output display device such as a printer or display screen, the objects are typically first rasterized (or "rendered") into bitmaps. The output display device stores display bitmap data in memory before displaying the data.

A problem in the prior art methods of providing bitmaps to output display devices is that a large amount of storage space is required to store the bitmap before it is displayed. The requirements for storage space have become greater as the desire for high-resolution representations with more realistic attributes has become more prominent. For example, using a laser printer capable of printing black-and-white images at a resolution of 600 dots per inch (dpi), a typical displayed page requires about $3.8 \times 10^6$ bytes of memory. When printing a page of color pixels, for example, having 8 bits per color per pixel, the memory requirement increases to about $121 \times 10^6$ bytes of memory. With such memory requirements, a significant portion of the cost of manufacturing an output display device such as a laser printer is the cost of the required memory.

A method that has been used to reduce the memory requirements for displaying high-resolution images involves the compression of the bitmap data according to a compression method or algorithm. A compression algorithm can significantly reduce the space needed to store bitmaps by removing information from bitmaps or other objects. Some compression algorithms are "lossless", meaning that they compress data and reduce storage requirements with no loss of essential information. This type of compression is often used with text objects and the like, since text character codes often include extra information unrelated to the identity of the text characters. Other types of compression algorithms are "lossy", meaning that they compress data with some loss of information. These types of compression algorithms are typically used with image bitmap data, since the loss of information can often be noticeable in a high resolution image. When the compressed bitmap is to be displayed, it is decompressed using a corresponding decompression algorithm and sent to the print engine, monitor, or other output display device.

A problem with the compression method of the prior art occurs when different types of objects are to be displayed by an output display device. For example, a page of data can include text objects such as words or paragraphs, graphics objects such as bar charts or geometric shapes, and image objects such as a digitized photograph. A compression algorithm that is good for text objects may, for example, be less than adequate for image objects, and vice versa. For example, lossy compression techniques may be adequate for image objects in that they can highly compress the image object data, but may be less than adequate for text objects, where the lost data would be apparent. A lossless compression technique is good for text objects, but may not adequately compress image objects. Thus, the selection of a single compression algorithm will almost always result in a less-than-optimal compression of mixed object types.

SUMMARY OF THE INVENTION

The present invention provides a method and apparatus for storing display data with reduced storage requirements. The present invention compresses multiple types of data objects using compression mechanisms that are optimized for each type of object according to user constraints. The compressed objects are then decompressed using a related decompression mechanism and sent to the output display device for display.

The apparatus of the present invention includes a digital output processing system with selective object compression and decompression. A rasterizer converts data objects into bitmap objects of various types. A compressor compresses the bitmap objects with a selected compression mechanism. The particular compression mechanism selected is dependent, at least in part, on the type of the particular bitmap object being compressed. For example, if the bitmap object is a text type, a graphics type, or an image type, then a compression mechanism best suited to text, graphics, or image data, respectively, is selected. The selection of compression mechanism also depends on the size of the available memory to store the compressed data and overall page analysis. The compressor produces compressed bitmap regions and stores the compressed bitmap regions in digital read/write memory associated with an output device. A decompressor then decompresses the compressed bitmap regions with a selected decompression mechanism determined by the selected compression mechanisms. The decompression mechanism for a particular compressed bitmap region is dependent upon the compression mechanism used to compress the bitmap region. The decompressor then supplies the uncompressed bitmap regions to an output display device for display. Suitable output display devices include printer devices and display screens.

The data objects input to the apparatus of the present invention are organized into at least one page that has multiple sections, called "bands." The bands preferably have a display order on the page, and bands of the page are displayed by the output display device in the display order. The data objects are stored in display lists corresponding to the bands of the page. Preferably, the bitmap objects and other background data in the band are rasterized and divided into non-intersecting bitmap regions which cover the band. The regions are designated as either empty regions covering no objects, or non-empty regions covering objects. The bitmap regions can be combined into larger regions according to specified constraints. Only the non-empty bitmap regions are preferably compressed by the compressor according to the assigned compression algorithms. The decompressor decompresses one page at a time by determining where an output scan line intersects regions on that scan line and decompressing the compressed regions when the scan line intersects the regions. The decompressor outputs background data to the output device when the scan line does not intersect the compressed regions.

In another aspect of the present invention, a method for providing a digital output with selective object compression and decompression includes steps of receiving output data having a type and compressing the output data with a selected compression algorithm chosen from a set of compression algorithms to produce compressed output data. The selected compression algorithm for the output data is dependent upon the type of the output data and meets a user's specified constraints for compression. The compressed output data is stored in digital read/write memory and is decompressed with a selected decompression algorithm to produce uncompressed output data. The decompression algorithm is chosen from a set of decompression algorithms and is dependent upon the compression algorithm used to compress the compressed data. The uncompressed output data is then supplied to an output display device.

The output data is stored as objects in display lists including an object type and an object location on a page of data. The display lists correspond to multiple bands into which the page is organized. The objects of one of the display lists are rasterized as bitmap objects in an uncompressed band and stored in an uncompressed band buffer. The band is partitioned into non-intersecting bitmap regions, where each bitmap region has at least one type corresponding to the type(s) of the object(s) which the region covers, or an empty type if no object is covered. A compression method is assigned to each region based on the types of the regions and any user constraints that include the compression ratio of the compression method and visual quality of the data after being compressed and decompressed. Adjacent regions and regions which include empty regions between them, and having the same assigned compression method, are preferably combined into larger regions. The non-empty regions of the uncompressed band are then compressed and stored in a compressed band buffer of the digital read/write memory. This step includes checking if the compressed regions fit in the compressed band buffer when compressed. If the band doesn't fit when compressed, previously-compressed bands are decompressed and recompressed to provide more storage space for the compressed band. Another band of the page is then rasterized and compressed. Once all the bands of the page are compressed, a page of compressed data is decompressed in scan line order and supplied to the output device. Background display data is provided to the output device for portions of the page that are not included by compressed regions.

An advantage of the present invention is that object data is compressed with compression mechanisms suited for each type of object included in display data. This allows much greater optimization of compression in that a compression mechanism can be chosen for each object type that provides the optimal tradeoff between image quality and level of compression. This permits a dramatic reduction in memory space requirements with minimal loss of image quality. In addition, only areas of a page that include object display data are compressed, so that "whitespace" or background areas do not have to be compressed and stored in memory. This allows an even greater reduction in memory space requirements for the display data. With less memory requirements for storing displayed data, the cost to produce an output display device can be drastically decreased.

These and other advantages of the present invention will become apparent to those skilled in the art upon a reading of the following specification of the invention and a study of the several figures of the drawing.

BRIEF DESCRIPTION OF THE DRAWINGS

FIG. 2 is a block diagram of an output device suitable for use with the present invention;

FIG. 2a is a block diagram of a digital processor as shown in FIG. 2;

FIG. 8a is a table of algorithm entries referenced by the process of FIG. 8 to assign algorithms to regions;

FIG. 8b is a table of indexes into the algorithm table of FIG. 8a for assigning algorithms to regions;

DETAILED DESCRIPTION OF THE PREFERRED EMBODIMENT

The present invention is well-suited for reducing the storage space requirements for rasterized data that is to be sent to an output display device. However, the present invention can also be used to generally reduce storage requirements when storing data of different types for a variety of purposes.

A number of terms are used herein to describe images and related structures. "Visual representation" refers to the image produced by an output device on a sheet of paper, display screen, etc. The term "image" is used to describe a type of visual representation or "object type." "Pixel" refers to a single picture element of a displayed visual representation. Taken collectively, the pixels form the representation. "Bitmap" refers to bits stored in digital memory in a data structure that represents the pixels. As used herein, "bitmap" can refer to both a data structure for outputting black and white pixels, where each pixel either is on or off, as well as a "pixel map" having more information for each pixel, such as for color or gray scale displays. "Raster", as used herein, refers to the arrangement of pixels on an output device that creates a visual representation by displaying an array of pixels arranged in rows and columns. Raster output devices thus include laser printers, computer displays, video displays, LCD displays, etc. "Render" and "rasterize" refer to the creation of an object bitmap from object primitives, such as a character outline or object in a display list. Both object primitives and object bitmaps are referred to as "objects" herein, where an "object" includes type and location information as well as data describing a visual representation which is to be derived from the object.

Figure 1:
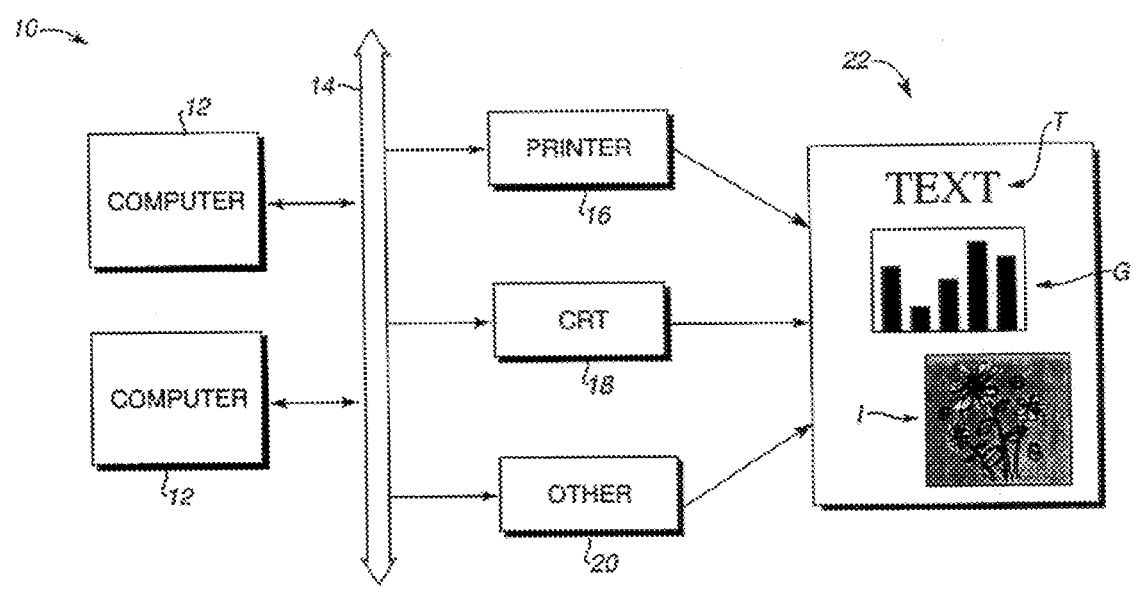
FIG. 1 is a block diagram of a computer system for displaying a page having objects of different types in accordance with the present invention.

In FIG. 1, a computer system 10 suitable for reducing storage requirements in the display of visual representations includes one or more digital computers 12, a communications bus 14, a printer 16, a display 18, or other output display device 20. The output of devices 16, 18, or 20 is a visual representation on a displayed page 22. Digital computers 12 can be personal computers (such as an IBM-PC AT-compatible or Apple Macintosh personal computer), workstations (such as a SUN or Hewlett-Packard workstation), etc. Computers 12 typically each include a microprocessor, a memory bus, random access memory (RAM), read only memory (ROM), peripherals such as input devices (keyboard, pointing device, voice recognizer, etc.), and storage devices (floppy disk drive, hard disk drive, etc.). In an alternate embodiment of the present invention, display data can be sent to other memory devices or storage devices instead of being sent to output display devices.

Printer device 16 is an output display device that can produce a printed visual representation of a displayed page 22 on a piece of paper, a transparency, etc. In the present embodiment, printer device 16 is a raster device which creates the visual representation with a plurality of printed dots arranged in rows and columns corresponding to a bitmap. That is, a bitmap can be input to the printer device 16 and the bits of the bitmap can be displayed as pixels. Alternatively, higher-level objects can be sent to the printer 16, and the printer can perform the rasterization process.

Display 18 is an output display device that displays visual representations on a screen. Display 18 can include a cathode ray tube (CRT), which is typically operated as a raster device. Other types of displays include LCD screens, electroluminescent displays, etc.

Other output display device 20 is any other form of device used to display a visual representation, in either a temporary or permanent form. Other output display devices include projection devices, plotters, etc.

To display visual representations on an output display device, such as printer device 16, display 18, or other output device 20, one or more types of procedures can be implemented. One procedure is to input data objects, and then rasterize bitmaps from the objects. For example, the object of a text character can include associated information which specify how the character is to be displayed, such as positional coordinates, size, font, etc.

A well known page description language for specifying objects and related information is the PostScript® language by Adobe Systems, Inc. of Mountain View, Calif. The object can, for example, include a bitmap describing a text character, or the object can reference or point to stored character outlines which describe the shape of a character and includes other rasterizing information, such as font and size. A well-known character outline format is the Type 1® format, by Adobe Systems, Inc. In addition, objects such as graphical shapes can be stored as graphic primitives, which are basic shape objects used to form more complex graphical shapes. From the objects, the computer 12 or output device 16, 18 or 20 can rasterize a bitmap and either send the bitmap to a memory cache or other storage area that is accessible for display or store the bitmap for later use.

The process of the present invention, as described below, provides a technique for manipulating bitmaps derived from objects so that less storage space is required when displaying the objects. As referenced herein, a "page description language" or "PDL" file is a file or similar storage unit which includes objects stored in a page description language such as PostScript or Portable Document Format™ (PDF™) by Adobe Systems.

Displayed page 22 includes visual representations produced by one of the output display devices 16, 18, and 20. Herein, a "page" of displayed data refers to a block or group of visual representations that can be viewed by the user as a unit. For example, a page of displayed representations from a printer device 16 can be the representations shown on a single sheet of paper (or more sheets, if a page is defined to span multiple sheets of paper). On a display screen 18, a page can comprise the representations shown at one time on the screen, or can comprise a grouping of representations of which only a portion can be viewed at a time. In page description interpreters such as the PostScript interpreter, a page of data is typically interpreted, processed and sent to an output display device before the next page is processed.

In the described embodiment, displayed page 22 includes several different types of visual representations. Herein, "types" of visual representations are the same as the "types" of the data objects from which the representations are derived. In the described embodiment, three types of data objects are addressed: text objects, graphics objects, and image objects. Other types of objects can also be defined and processed in alternate embodiments of the present invention. In the present embodiment of the invention, the type of an object can be defined by the commands, data, and operations used to display the object and the object's ability to be compressed/decompressed more efficiently and with less loss of quality using particular compression algorithms as opposed to other algorithms. For example, specific types of data (character codes), procedures, character outlines, etc. are used to describe a text object, which is known to compress more efficiently using particular algorithms. Thus, the type "text" is defined in view of these factors. Object types can be defined in other embodiments based on, for example, the final appearance of the displayed object, the resolution of the object as displayed, or other criteria.

Text representation T is derived from a bitmap that, for example, was rasterized from text objects. For example, a character code in a text file can used to index a character drawing procedure which defines a text object, as is well known to those skilled in the art. Graphics representation G is derived from a bitmap that was rasterized from coded graphics objects, such as trapezoids and lines. These primitive graphics objects can be sized and shaped to describe the graphics object. Image representation I is typically not derived from any coded objects, since its original form is a bitmap, also referred to as an object. Scanned images, digitized photographs, etc., are data objects of the image type which are in bitmap form and can usually be displayed by an output display device directly or with a transformation of coordinates.

Visual representations T, G, and I may all be displayed, and even overlap each other, on a single page of displayed data. These types of objects are each compressed into a band buffer using an optimized compression algorithm for each type of object, as described below in greater detail.

FIG. 2 is a block diagram of an output display device which, as an example, will be described as printer device 16. Printer device 16 preferably includes a buffer 24, a digital processor 26, RAM 28, ROM 30, I/O interface 32, and print engine 34. Buffer 24 is a memory buffer used to buffer data received from computer 12. Printer device 16 may process input data at a different rate than the rate the data is output from a computer 12; buffer 24 is used to interface these rates.

Digital processor 26 includes one or more digital integrated circuits used to control the operation of printer device 16. Using instructions retrieved from memory, processor 26 controls the reception and manipulation of input data and the output and display of data on output devices. In the described embodiment, a function of processor 26 is to rasterize object data into bitmaps. Therefore, in the present invention, printer device 16 performs the rasterization process. This is typical of PostScript printers.

Processor 26 preferably reads commands and data in a page description language, such as PostScript, from buffer 24 and interprets/executes the commands to rasterize a bitmap. The processor then compresses the rasterized bitmaps according to the object types of the bitmaps and decompresses the bitmaps before sending them to the print engine to be displayed. The processor makes use of other components in the printing device, such as RAM 28 and ROM 30. Digital processor 26 is described in greater detail with respect to FIG. 2a.

Bus 27 is used by digital processor 26 to access RAM 28 and ROM 30, which are memory components used to store data required by the printer device 16 to process and display output data. RAM 28 is used by processor 26 as a general storage area and as scratch-pad memory, and is preferably used to store input data and the compressed data produced by the present invention. RAM 28 can be implemented with one or more memory chips. ROM 30 can be used to store instructions followed by processor 26 as well as character outlines and object primitives used to display visual representations in a specific format. For example, when rasterizing text objects such as characters, the characters' associated character outlines can be referenced in ROM 18 when bitmaps of the characters are rasterized to be displayed as text representations by the printer device.

I/O interface 32 is used to interface the bitmap data generated by the microprocessor with the print engine 34. Output bitmap data can, for example, be sent to I/O interface 32 via bus 27. I/O interface 32 provides the bitmap data to print engine 34, which uses the bitmap data to produce a display page 22 as shown in FIG. 1. The print engine of a laser printer, as is well known to those skilled in the art, typically includes such components as a toner mechanism for applying a visual representation to a piece of paper, feeding mechanisms, and other components required to produce a displayed page. If an output device such as a display screen is being used, the print engine can be a CRT or other actual screen which displays visual representations derived from the bitmap. Alternatively, output bitmap data can be sent directly to print engine 34 from processor 26 via direct line 31.

The components shown in printing device 16 in FIG. 2 can alternatively be included in computer 12 rather than print device 16 or any other output display device. For example, the digital processor 26, RAM 28, ROM 30, and I/O 32 can be included in computer 12 and can provide output bitmaps to print engine 34 located in the output display device. RAM 28, used to store compressed data, can be associated with the actual output display device that displays the visual representation and be located external to the output display device.

The compression of displayed data, as described below, is implemented by digital processor 26 and can be accomplished on computer 12; the decompression of this data can then be implemented on an output device 16, 18, or 20. However, in such an embodiment, standard compression algorithms would preferably be used by computer 12 so that an output device could readily decompress data from any computer sending it data (or a description of the used compression algorithm would be sent with the compressed data so that the output device could understand the compression algorithm and decompress the data). If all compression and decompression takes place in the output device, as shown in FIG. 2, standard or non-standard compression algorithms can be used.

In an alternate embodiment, computer 12 can send compressed data to a storage device (not shown), such as a hard disk drive, floppy disk, PCMCIA card, magnetic tape, etc., for storage prior to displaying the data.

FIG. 2a is a block diagram of digital processor 26 shown in FIG. 2. In the described embodiment, processor 26 includes a CPU 36 and an application specific integrated circuit (ASIC) 38. The CPU is preferably a general purpose microprocessor which controls the operation of printer device 16. CPU 12 can be a single-chip processor or can be implemented with multiple components.

In the described embodiment, ASIC 38 is an integrated circuit designed to perform the compression and decompression operations. ASIC 38 uses compression algorithms that are preferably implemented in hardware in the ASIC. The compression algorithms are selected by software routines implemented by CPU 36 to compress bitmaps so that the bitmap will require less space to be stored. ASIC 38 also uses decompression algorithms for decompressing the compressed bitmaps back to their original size and form using parameters specified in the compressed data. In other embodiments, compression and decompression can be performed by software or by other hardware components in the computer system. A RAM 39 can also be implemented locally to ASIC 38 to store structures and data used during compression and decompression.

Many compression/decompression algorithms are known to those skilled in the art and some are described below. The present invention utilizes multiple compression algorithms to achieve a more efficient reduction in required storage space for a bitmap that is to be displayed with minimal loss of display quality, as described below.

Figure 3:
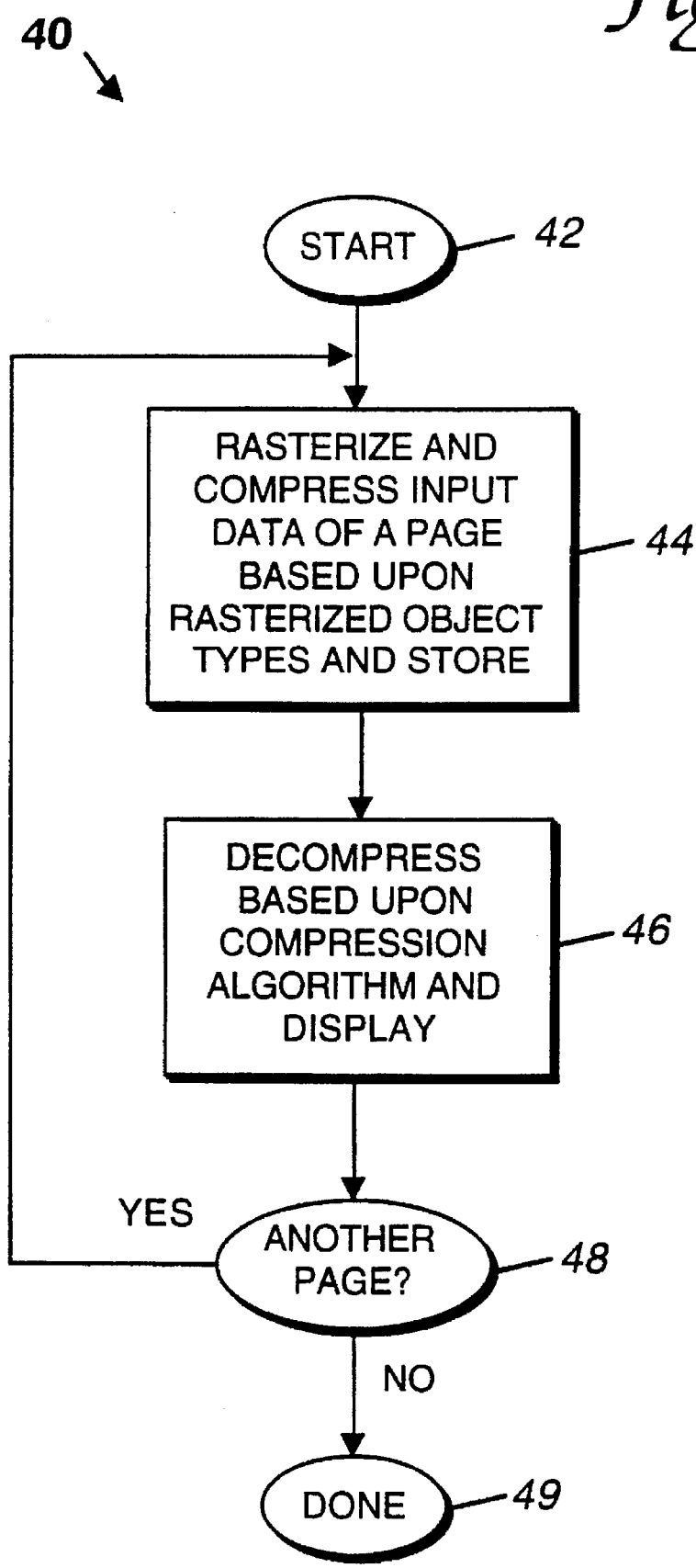
FIG. 3 is a flow diagram illustrating the process of displaying data with reduced storage requirements according to the present invention.

FIG. 3 is a flow diagram illustrating the process 40 of displaying data with reduced storage requirements according to the present invention. The process begins at 42. In step 44, a single page's content of input data is rasterized and compressed based upon rasterized object types. Step 44 entails several individual steps, including creating display lists of objects from input data, rasterizing the objects within the display lists into bitmap objects in bands, compressing the bands according to the types of objects located in the bands, and storing the compressed bands in memory. This process is described in greater detail with respect to FIGS. 4a, 4b, and 4c. By compressing the rasterized data, the amount of memory required to store the data can be significantly reduced.

In step 46, the digital processor decompresses the compressed bands that have been stored in memory and sends the decompressed data, one band at a time, to the display engine. This is accomplished using decompression algorithms and information stored in each compressed band. Data in a band is sent directly to the display engine to be displayed as soon as it has been decompressed. The page has been completely displayed when all compressed bands have been displayed. In an alternate embodiment of the present invention, the compressed band is decompressed and stored in a different memory or storage area for multiple uses, including display. The process of decompressing and displaying the bands of data is described in greater detail with respect to FIG. 13. In next step 48, it is determined whether another page of data is to be displayed. If so, the process returns to step 44 to rasterize, compress, decompress, and display the next page's worth of data in steps 44 and 46. If there are no more pages to display, then the process is complete as indicated at 49.

Preferably, a page of data can be compressed simultaneously with the display of a previous page in a document or other group of pages. For example, as data from the first page is still being decompressed or displayed in step 46, the second page in the document can be rasterized and compressed in step 44 simultaneously. Similarly, multiple pages can be decompressed simultaneously. For example, multiple tandem decompression engines can decompress multiple pages wherein each decompression engine decompresses and displays a certain color or shade on a side of a page. Each page can be passed through the pipeline of decompression engines, where each decompression engine receives the next page in the pipeline when it finishes with its current page. Such a process can also be used with the compression and rasterization of the present invention. In an alternate embodiment, instead of compressing, decompressing and displaying output display data on a page-by-page basis, each "band" or other portion of a page can be sequentially compressed, decompressed and displayed.

Figure 4A:
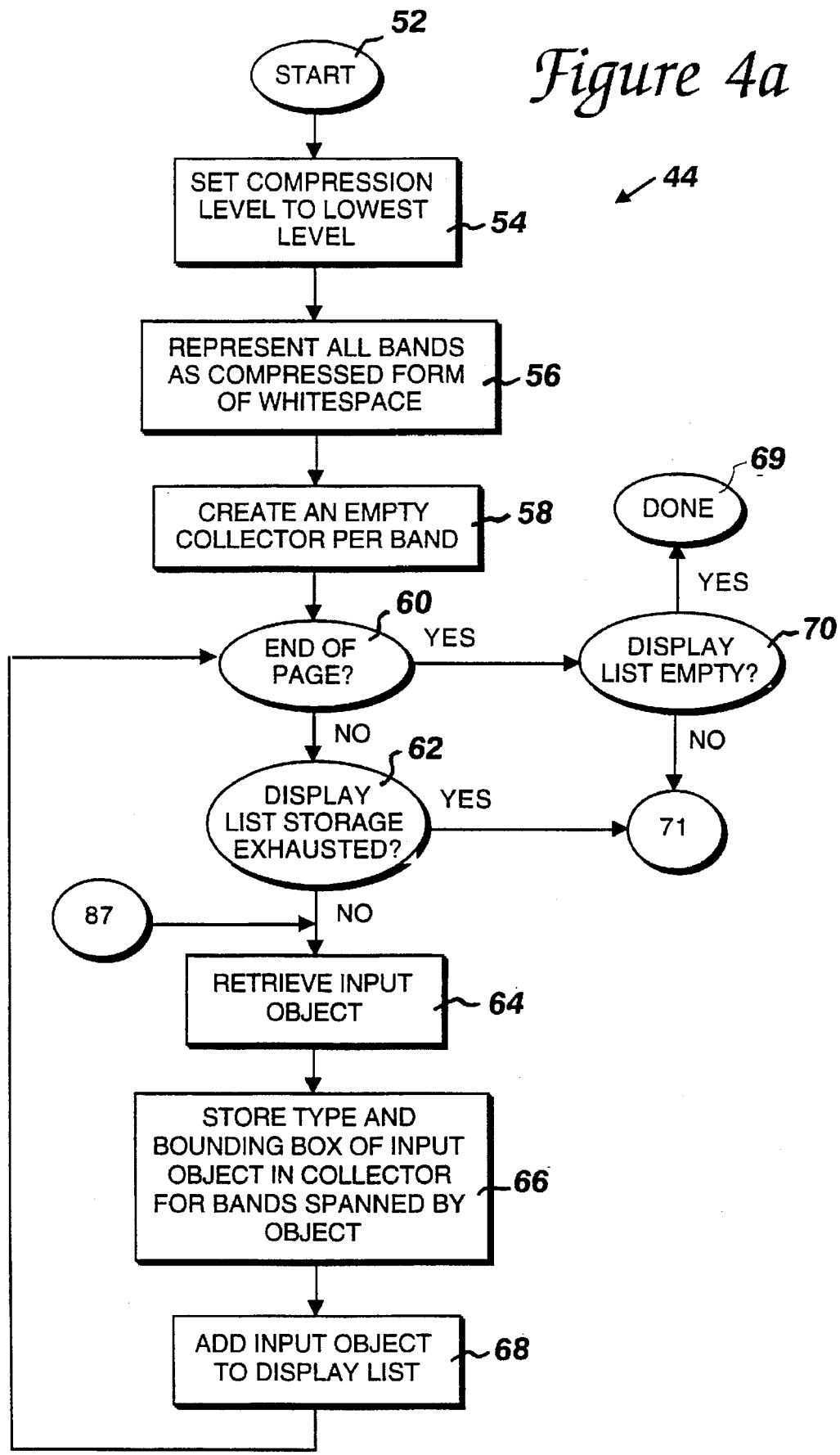
FIG. 4a is a flow diagram illustrating the first portion of the rasterize and compress input data step of FIG. 3.

FIG. 4a is a flow diagram illustrating a first portion of the rasterize and compress input data step 44 of FIG. 3. The process begins at 52 and implements three initialization steps 54, 56, and 58. In step 54, the compression level used for compressing data in the present invention is set to the lowest available level. The compression "level" determines the compression ratio for compressing data, where a lower level typically corresponds to a lower compression ratio (i.e., a lower amount of compression) as described herein. In next step 56, all bands on the current page are represented as a compressed form of whitespace. Whitespace (or "background" data) refers to white or unmarked areas of a page that do not include any object data to be displayed in those areas. A page is partitioned into a number of bands, where each band is analyzed and compressed separately. An example of bands 112 of a page 110 are shown in FIG. 4d and are described in further detail below. The compressed whitespace data is stored in the compressed band buffer, as described below. In step 58, an empty collector is created and initialized for each band 112 of the current page 110 so that every band has an associated collector. A "collector", as referred to herein, is a data structure or other storage area and/or associated instructions that store data associated with that collector's associated band. Data stored in the collector is used to compress objects included in the associated band.

In next step 60, the process determines whether the end of the page has been reached, i.e. whether all input data for the page has been added to display lists. The end of the page can be detected, for example, by receiving an end-of-page command or indicator from the page description language file. If it is not the end of the page, then step 62 is implemented, in which the process checks whether the display list storage is exhausted. Input objects are stored in display lists, which are portions of available memory, such as RAM 28 and/or additional memory. This available storage may become full before all input objects of a page are stored in display lists. If this occurs, the input objects in a selected band's display list are immediately rasterized and the band is compressed, which allows those input objects to be removed (or written over) in the display list. This frees space in the display list to store additional input objects. This procedure is known as "cycling", since portions of the compression method of the present invention are cycled to free space in a display list. A band may be compressed having only a portion of its input objects and then decompressed to allow additional input objects to be added (rasterized) into the band, as described below. If display list storage is exhausted, the process continues to node 71 of FIG. 4b to compress the (possibly incomplete) band, as detailed below.

If the display list storage is not exhausted, step 64 is implemented, in which an input object is retrieved. The input object is preferably received by the digital processor 26 in buffer 24 (as shown in FIG. 2) from computer 12. The input object can be in several different forms and formats. For example, the input object can be in the PostScript® language or in a different page description language as part of a page description file. In the described embodiment, the input object generally is an "object primitive" or "graphic primitive," which is a basic graphical object that has an object type. For example, the object can be a character or a word bitmap or code having a text type. The object can also be a trapezoid, line, or other primitive shape from which other, more complex, shapes are constructed; such a shape can be considered to have a graphics type. The object could also have an image type, i.e. the object can be an image segment bitmap having pixels of defined location and color, if appropriate. In general, herein, "object" refers to the type, bounding box, and description data of an input object, and can refer to objects in bitmap form or in non-bitmap form.

In step 66, the type and the bounding box (size and location) of the input object are stored in the appropriate collectors for the bands spanned by the object. The type of the object is one of several types that have been previously defined. For example, text, graphics and image types are described herein; additional types can also be provided. The type of an object can be determined from the input data describing the object. For example, if the input object has been specified in language such as PostScript, the type of an input object is evident from the commands of the PostScript file. PostScript can specify the type of a object in the context of the commands pertaining to the object, and a PostScript interpreter can be used to identify this type. For example, a SHOW (X) command is known to display text characters, so the object X is known to be of text type. When the input object was originally output by, for instance, a word processor, spreadsheet, or other PostScript-generating program, these commands were created in the PostScript file. If the input object was originally output by a graphics object type editor or drawing program such as Adobe Illustrator®, graphics-type commands (MOVETO, LINETO, FILL, etc.) inform the PostScript interpreter that the data has a graphics type. If the object was originally output from an image bitmap editor or program such as Adobe PhotoShop™, then the data can be identified from image type commands in the file, as is well-known to those skilled in the art. A PostScript interpreter can handle all of the other commands and information in a PDL file, and provide just the input objects to the present process in step 64.

The location and size of the object is also stored in collectors. In the described embodiment, the location/size of an object is stored as bounding box coordinates. A bounding box is a rectangle or other polygon whose sides are positioned at or just outside the edges of the object so that the object is completely enclosed by the rectangle. Four sets of x, y (e.g., horizontal, vertical) coordinates are preferably stored as the location/size of the object, where each set of coordinates describes one of the four corners of the bounding box. Alternatively, two sets of coordinates for opposite corners of each bounding box can be stored as the location of the object. Other methods can also be used to describe the bounding box, such as storing one corner and the width and height of the box, etc.

The appropriate collector(s) to store an object's type and bounding box is determined by examining the bounding box coordinates of the object to determine which bands the object spans. As shown in FIG. 4d, a page 110 of data is preferably partitioned into a number of bands 112, which are portions of a page having a predetermined size. The bands of FIG. 4d are shown as horizontal sections of a page; however, in other embodiments, bands can be defined as other areas of the page. Each band is processed and compressed sequentially; this allows a smaller amount of data to be processed at one time so that the entire page of data does not have to be stored in memory. In the preferred embodiment, the page 110 is partitioned into 10–12 bands of equal size (e.g. 256 rows or scan lines for each band), although, in other embodiments, the number and size of bands can depend on the page size, resolution of displayed representations, the size of the available uncompressed band buffer (see below), etc. Herein, "horizontal" and "X coordinate" refer to a dimension parallel to a scan line in the display of output data on an output display device, as described with reference to FIG. 13. This dimension is shown as the "left-right" dimension in FIG. 4d. "Vertical" or "Y coordinate" correspondingly refers to the dimension perpendicular to the horizontal dimension, and is shown as the "up-down" dimension in FIG. 4d.

A number of objects are shown displayed on page 110. Both the type and the bounding box of each object is stored in the appropriate collectors. Object 114 has a text type and has a overall bounding box 120. Object 116 is a graphics object having a graphics type and has an overall bounding box 122. Object 118 is an image object having an image type and an overall bounding box 124.

For an object that spans only one band, the overall bounding box of the object is stored in the associated collector of the band. However, an input object can span more than one band as well. For example, text object 114 spans bands 113, 115, and 117; graphical object 116 spans bands 115, 117, and 119; and image object 118 spans bands 121, 123, and 125. In these cases, a "clipped" portion of the overall bounding box of the object is stored in a band's collector, where the stored bounding box is the intersection of the overall bounding box with the band. That is, objects which overlap multiple bands are preferably divided into multiple objects that each fit in one band and collector. For example, text object 114 is clipped such that only the coordinates of a bounding box in band 113 for object 114 are stored in the collector of band 113. Text object 114 is clipped again so that only the coordinates of text object 114 within band 115 are stored in the collector for band 115, and so on. Methods for clipping objects are well known to those skilled in the art. Alternatively, clipping can be performed at a later stage in the process before or during rasterization step 78 of FIG. 4b.

After the type and bounding box of the object(s) have been stored in the appropriate collector(s), step 68 is implemented. In step 68, the input object is added to the appropriate display lists. For each band 112, an associated display list is created (or was previously created), and the current input object is added to the appropriate display list or lists, i.e., the data describing the appearance and content of the object is added to the appropriate display list. If an object overlaps more than one band, just the object data included in a band is stored in the display list associated with that band by a clipping process. Alternatively, all of the object's descriptive data is stored in each display list associated with overlapped bands, and the object can be "clipped" before or during the rasterization step 78 of FIG. 4b. Thus, all of the object data on the page is grouped into the appropriate bands. This is desirable for data that is stored in a page description language such as PostScript, since the data of such a page description language is typically not stored in display order. The location (coordinates) of each object, known from the description in the page description file, determines the appropriate display list(s) on the page for that object. As input data is received, each object is placed in its appropriate display list, possibly grouped with other objects displayed in the same bands and thus stored in the same display lists.

In an alternate embodiment, display lists do not have to be built. In a page description language where data is stored and input in sorted display order, the data can be directly organized into bands and rasterized as described below.

After step 68, the process returns to step 60, where the process checks whether the end of the page has been reached. If not, steps 62–68 are again implemented for another input object. When the end of the page is reached, step 70 is implemented, in which the process checks whether all display lists are empty. If true, this indicates that no objects were found to be displayed on the current page and thus no objects were stored in display lists, and the process is complete at 69. If the display lists are not empty, then the process continues to node 71 of FIG. 4b, which continues to step 72.

Figure 4B:
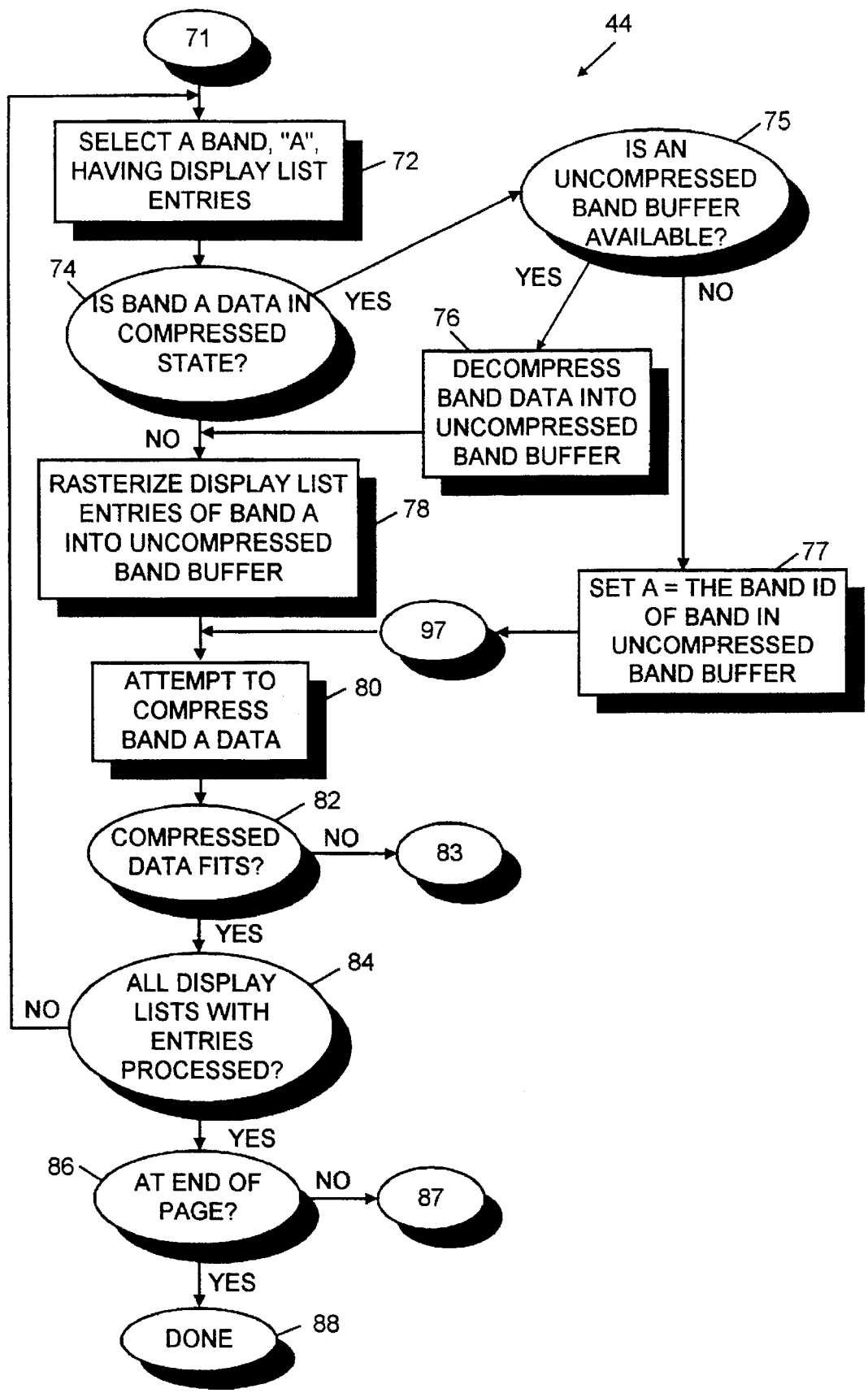
FIG. 4b is a flow diagram illustrating the second portion of the rasterize and compress input data step of FIG. 3.

FIG. 4b is a flow diagram that continues the process 44 of FIG. 4a. From node 71, the process continues to step 72, where a current band "A" is selected which has display list entries. Preferably, bands are selected in display order, i.e., the order that an output device displays the bands, typically starting from the top of the page going to the bottom of the page. If a band has no display list entries, it is skipped. In an alternate embodiment, the display lists can be retrieved in reverse display order, i.e., in the opposite order that the objects are displayed by an output device, so that the display list at the bottom of the screen would be retrieved first, followed by the next bottommost display list in the next iteration, etc. Reverse display order allows the last display list that is retrieved and rasterized to be sent directly to the display engine to be displayed without having to be compressed and stored, as described below. However, the time to compress the data is typically short enough so that display list retrieval order does not largely affect the time to display data in the described process.

In next step 74, the process checks whether the band "A" data is in a compressed state. The location in the compressed band buffer and state of the data (i.e., "compressed" or "not compressed") for the current band can be retrieved from a "band record", for example, that stores such information for each band from the compression process (detailed below). If the band A data is not in a compressed state, then the process continues to step 78, described below. Band A data typically is in a compressed state in two circumstances. Band A may be a newly selected band, in which only the whitespace "background" data for the band was compressed in step 56 of FIG. 4a. This whitespace data is in a compressed state stored in the compressed band buffer. Band A can also have been previously compressed in a "cycling" loop. If the display list storage was exhausted in step 62 of FIG. 4a, then band A may have been previously selected and compressed. If so, it may already stored as compressed data in the compressed band buffer including some input objects and must be decompressed (in step 76) to add (rasterize) any additional input objects to the band.

If the band A data is in a compressed state, then step 75 is implemented, in which the process checks whether there is an available section of the uncompressed band buffer to store the current band. As described below, the uncompressed band buffer is used to store an uncompressed band. If it is currently full from storing one or more other bands, then the process continues to step 77, in which band A (the current band) is set to a band that currently occupies a section of the uncompressed band buffer. The process then continues to node 97 to compress that band by the process of the present invention to free the uncompressed band buffer. This process is described below. Once that band is compressed, the uncompressed band buffer is available, and the process returns to step 72 (as described below) to again select the original band A (or, alternatively, another band).

If there is a storage section of the uncompressed band available in step 75, then the process continues to step 76, in which the band A data (in the compressed band buffer) is decompressed into a storage section of the uncompressed band buffer using a decompression algorithm corresponding to the algorithm used to compress the data. Decompression is described in greater detail below with reference to FIG. 12.

The uncompressed band buffer is a memory storage preferably included in RAM 28 that can store at least one band of uncompressed data. In the preferred embodiment, the uncompressed band buffer can store two or more bands' worth of uncompressed data. Each portion of the uncompressed band buffer that can store a band's worth of data is referred to as a "storage section" of the uncompressed band buffer. For example, the current band A is preferably stored in a first storage section of the uncompressed band buffer. The current uncompressed band is later compressed and stored in the compressed band buffer preferably before a new band is written into the uncompressed band buffer, as described below. In an alternate embodiment, multiple uncompressed band buffers can also allow rasterizing and compressing of different bands to be performed simultaneously.

After step 76, or if the band data is not in a compressed state in step 74, then step 78 is implemented. All the display list entries (objects) of band A are retrieved from the display list for band A, rasterized into bitmaps, and stored in the storage section of the uncompressed band buffer which holds the decompressed data from step 76. This storage section of the uncompressed band buffer thus includes decompressed whitespace data (and any previously-compressed rasterized input objects) for the band from step 76, and has rasterized bitmap objects added to it in step 78.

The process of rasterizing an object into a bitmap object is well-known to those skilled in the art. For example, if a text object is to be rasterized, procedures and character outlines stored in ROM 30 can be referenced and used to create the rasterized bitmap of the characters of the text object. If a graphics object is to be rasterized, then the graphics primitives making up the graphics object are rasterized according to established methods and combined to form the rasterized graphics bitmap. An image object may already be in bitmap form and thus may not need to be rasterized in cases where a 1-1 correspondence exists between image pixel space and output device pixel space. In cases where such a correspondence does not exist, a translation between image and device spaces can be performed in the rasterization step as is well-known to those skilled in the art. The image bitmap object is stored with all the other bitmap objects in the uncompressed band buffer.

In next step 80, the process attempts to compress the rasterized data of band A that is stored in the uncompressed band buffer. This step involves dividing the bitmap objects into non-intersecting regions, assigning types to the regions, assigning appropriate compression algorithms to the regions, and attempting to compress the region data into a compressed band buffer at the current compression level. Step 80 is described in greater detail below with reference to FIG. 8.

In step 82, the process determines whether the compressed data for band A fits in the available memory of the compressed band buffer. The compressed band buffer is preferably implemented in RAM 28 or similar memory. Since only a specific amount of memory is allocated in the compressed band buffer for all compressed bands, there is the possibility that the compressed data requires more storage space than the available allocated amount of memory. Note that, in the described embodiment, the process preferably compresses and stores a small portion of uncompressed band data before compressing and storing the next portion of uncompressed band data. If the process writes compressed data to the compressed band buffer and runs out of storage space when data still needs to be compressed and stored, then the current band has overflowed the available storage space and does not fit. In the preferred embodiment, the process continues to compress data and counts the number of bytes of compressed data produced, but does not write the compressed data to the compressed band buffer. This allows the processor to determine the actual storage requirement of the compressed band. Alternatively, the processor can compress and write the overflowed data into the compressed band buffer over previously-compressed data for this band until no more data is available and the amount of overflowed data is known.

Since the compressed band data does not fit, the process continues to node 83 of FIG. 4c, described below. In alternate embodiments, the processor can calculate or assume that a certain amount of space is required without having to continue to compress overflowed data to find the precise storage requirements. For example, the processor can assume that a certain amount of storage space is required for the current band based on the compression algorithm (the compression ratio) used and how much data was stored before overflow, or by multiplying the available space by a predetermined number.

In alternate embodiments, the current band can also be considered not to "fit" if it was not compressed within a user's constraints. For example, if the compression was not as efficient as expected, the band data would be using more storage space than desired and could be considered not to "fit", even though there is sufficient memory to store it.

If the compressed band A does fit in the available memory space of the compressed band buffer, then step 84 is implemented, in which the process checks whether all display lists have been processed for the page, i.e., whether the display lists are empty. If there is another display list to rasterize and compress, then the process returns to step 72. If all display lists have been rasterized and compressed, then the process continues to step 86, where the process checks if the last compressed display list was at the end of the page. The case where all display lists have been rasterized and compressed but the end of the page has not been reached can occur when display list storage is exhausted before all input data of a page is added to display lists, as checked by step 62 of FIG. 4a. If this is the case, then more input objects from the current page need to be added to display lists. Thus, if the last compressed display list is not at the end of the page, then the process continues from step 86 to node 87 of FIG. 4a, where another input object is retrieved and added to a display list. If the end of the page has been reached in step 86, then the process is complete at 88.

Figure 4C:
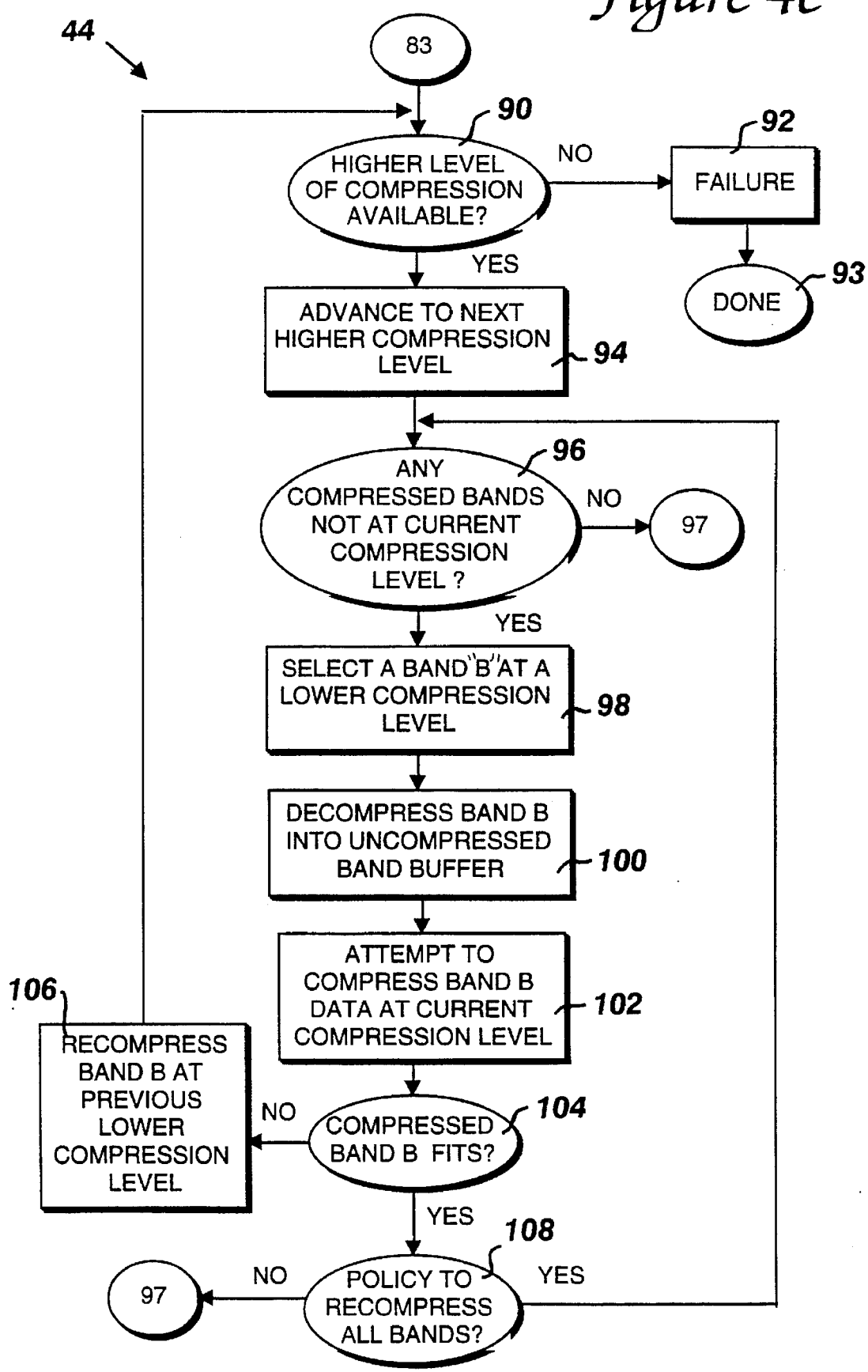
FIG. 4c is a flow diagram illustrating the third portion of the rasterize and compress input data step of FIG. 3.
Figure 4D:
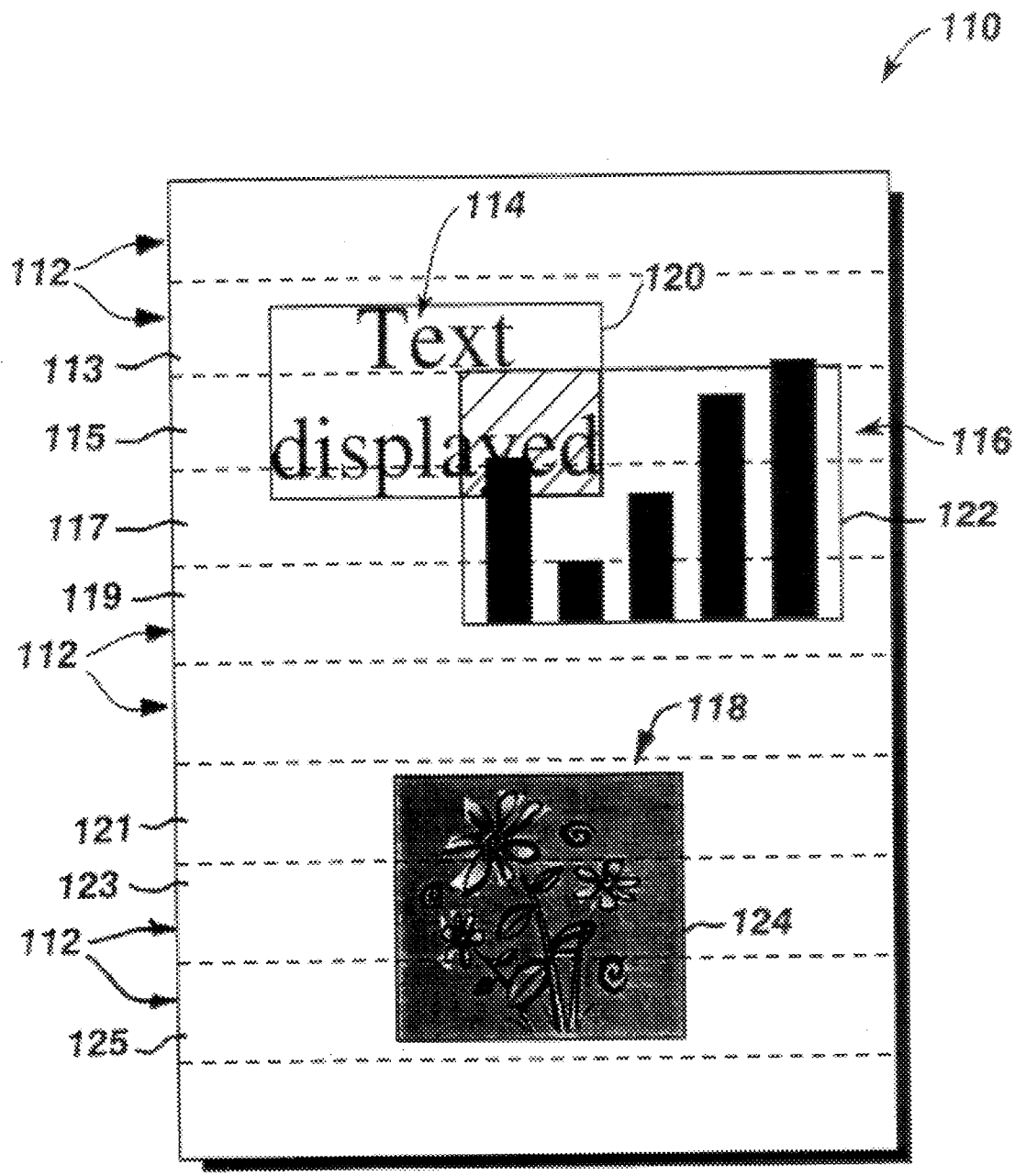
FIG. 4d is a diagrammatic illustration of a page of objects, the page being divided into bands.

FIG. 4c is a flow diagram illustrating the continuation of the process 44 shown in FIGS. 4a and 4b. The process arrives at node 83 when the rasterized data compressed in step 80 does not fit in available storage space in the compressed band buffer. From node 83, the process continues to step 90, in which the process determines if a higher level of compression is available, i.e. if a compression level (algorithm) is available that will reduce the storage requirements of the band data more than the previously-used compression level. Preferably, compression algorithms are ranked by number based on compression ratio and provided in a hierarchy of compression levels for each object type, where typically the more lossy compression algorithms for an object type are provided at higher levels of the hierarchy. If there is no higher compression level, then a "failure" result is indicated in step 92, indicating that there is not enough memory available to store the band data. The process is then complete as indicated at 93. As a practical matter, a number of compression levels, known compression ratios, and a large enough compressed band buffer are provided so that the possibility of failure is very remote or even non-existent.

If a higher level of compression is available in step 90, then step 94 is implemented, in which the next higher compression level is selected. For example, a compression level magnitude can be incremented. In step 96, the process checks if any previously-compressed bands have not been compressed at the current compression level. This can be accomplished by checking the compression level information stored in the band record. If all previously compressed bands are at the current compression level, then they have all been recompressed (according to steps 98–106 below) at the new compression level. The process then continues to node 97 of FIG. 4b, which implements step 80 to compress the band A data at the current compression level.

If any of the previously-compressed bands have not been compressed at the current compression level, then step 98 is implemented. A previous band "B" that is stored in the compressed band buffer and was previously compressed at a lower compression level is selected. The selection of previous band B can be determined by several factors. In the described embodiment, the first compressed band in the compressed band buffer is chosen. In other embodiments, different bands can be chosen depending on how many bands are to be reanalyzed and recompressed in the implemented embodiment (described below). For example, only the single band just previous to the current band A can be chosen.

In step 100, the selected band B is decompressed into the uncompressed band buffer using information stored in the band. Preferably, band B is decompressed into a "second" band storage section of the uncompressed band buffer so that both band A and band B are simultaneously stored in different storage sections of the uncompressed band buffer. To decompress band B, decompression parameters from the compression band buffer are retrieved. These parameters include the compression algorithms used to compress each region in the band and other parameters, as described in greater detail with respect to FIGS. 8 and 12. The process decompresses the previous band B, region by region, back into the second storage section of the uncompressed band buffer based on the decompression algorithms associated with the compression algorithm used for each region. The decompression algorithms perform the reverse operation of their associated compression algorithms. Note that an entire region is decompressed at a time from the compressed band buffer to the uncompressed band buffer, which is different from scan line decompression to a output display device as described with reference to FIG. 13.

In step 102, the process attempts to compress band B data into the compressed band buffer at the current compression level. This is accomplished similarly to step 80 of FIG. 4b, and is described in greater detail with reference to FIG. 8.

In next step 104, the process checks if band B fits in the compressed band buffer. This step is accomplished similarly to step 82 as shown in FIG. 4b. Compressed band B typically fits at the current compression level, since band B already had fit using the previous compression level, and since the compression algorithm at the current compression level usually achieves a higher compression ratio (perhaps by being more lossy than the previous compression level) to allow band B to fit in a smaller space. However, band B may not fit at the current compression level due, for example, to the data of band B not being particularly suited to the current compression algorithm, e.g., a text-based compression algorithm being used on image data. If band B does not fit, then step 106 is implemented, in which band B is recompressed at the previous, lower compression level which is already known to compress band B sufficiently. The process then returns to step 90 to attempt to set the current compression level to the next higher level.

If compressed band B does fit in the compressed band buffer in step 104, then step 108 is implemented, in which the implemented policy is checked. In the preferred embodiment, the policy is to recompress all previous bands at the current compression level. This policy allows all data of the same type will appear at about the same quality on the entire displayed page, since all of the bands were compressed at the same compression level having about the same lossiness. Thus, after step 108, the process returns to step 96 to compress another previous band B until all previous bands are compressed at the current compression level. After all previous bands have been recompressed, current band A is compressed at the current compression level, as shown in FIG. 4b. If band A fits, then the process rasterizes and compresses the next display list as shown in FIG. 4b.

Alternatively, a policy can be implemented in which only just enough previous bands are recompressed to allow the current band A to fit in the compressed band buffer. This policy recompresses previous bands at the higher level to free up more room for the current band A, and may in some instances require less processing time than the method of recompressing all previous bands (depending on how many previous bands have to be recompressed at this stage for other bands). However, in such an implementation, the quality of displayed objects may vary due to different compression levels being used on different bands. For example, defects might be visible between a portion of an image object in one band that was compressed with one compression algorithm and the remaining portion of the image object in an adjacent band that was compressed with a different compression algorithm. If this policy is used, then, after step 108, the process continues to node 97 of FIG. 4b, which causes band A to be compressed at the new compression level and checked if it fits. Alternatively, the process can determine when enough storage space has been freed by comparing the saved space from the recompression of band B to the known additional space needed for the current band A.

The process of rasterizing and compressing output data as described in FIGS. 4a, 4b, and 4c can be implemented in software and/or hardware. In one embodiment, the objects of the input data can be rasterized and the display lists, data structures, etc. can be stored through the use of software, while the compression/decompression can be implemented in hardware using gates, an ASIC (as shown in FIG. 2a), etc. In other embodiments, the entire process can be implemented using software (or hardware). In many instances, however, a full implementation in software currently causes output data to be displayed too slowly for many applications.

Figure 5:
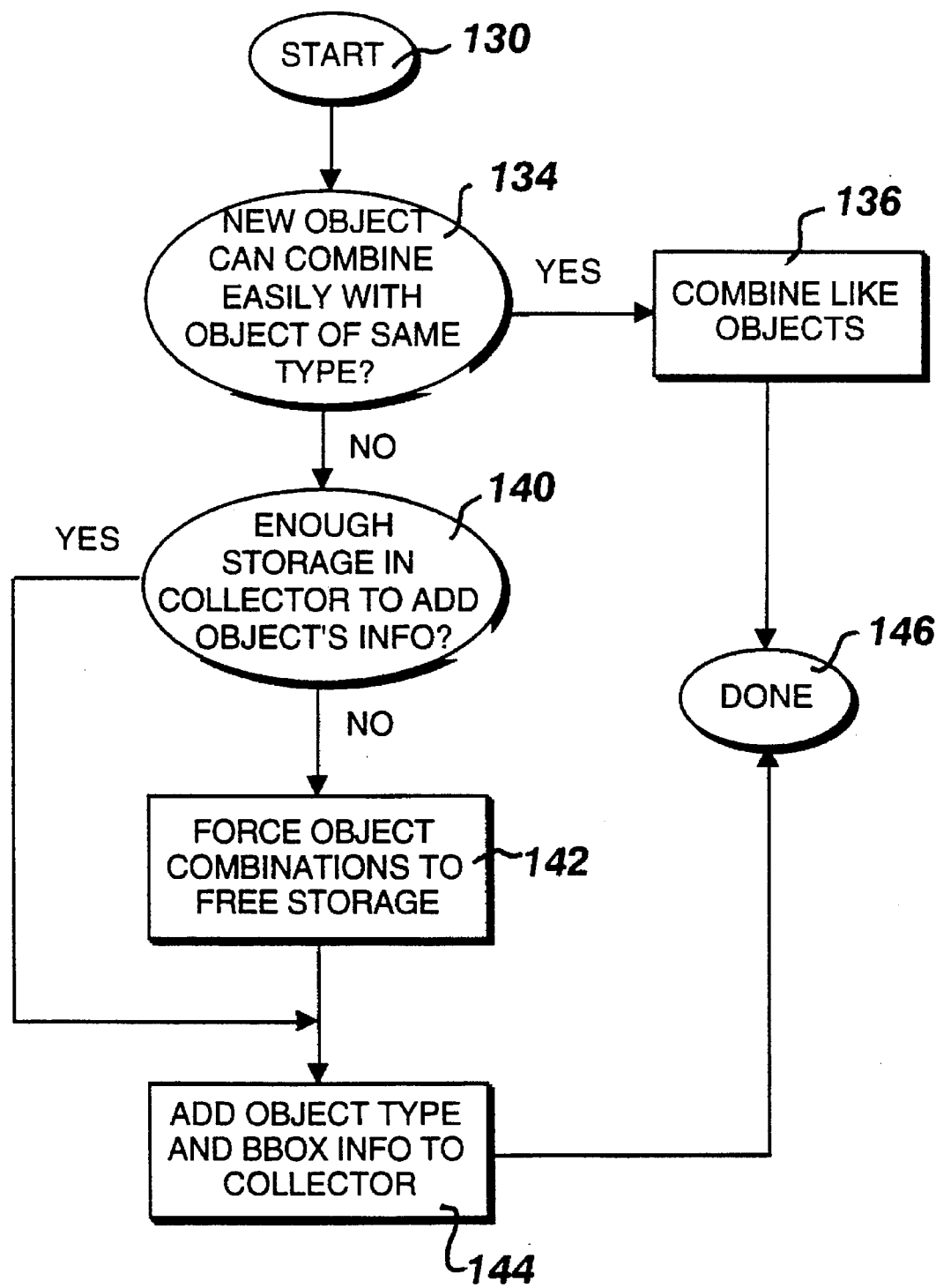
FIG. 5 is a flow diagram illustrating a step of FIG. 4a in which input object type and bounding box information is stored in collectors associated with bands.

FIG. 5 is a flow diagram illustrating step 66 of FIG. 4a, in which the type and the bounding box of an input object are stored in the appropriate collectors for the bands spanned by the object. The process begins at 130, and, in a step 134, the process checks in step 134 if the new object can combine easily with a stored object of the same type that is stored in the collector. The objects stored in the collector are each examined and compared to the new object to determine whether the objects can be easily combined. An "easy" combination can be indicated by a number of conditions. In the preferred embodiment, if the bounding boxes of the new object and a stored object have equal or nearly equal Y coordinates for the top and bottom edges of the bounding boxes, the bounding boxes are no more than a small distance apart in X coordinates, and the objects have the same type, then the two objects are "like" objects and can be easily combined. These conditions also apply to objects having the same type and having equal or nearly equal X coordinates for the left and right edges of the bounding boxes and which are no more than a small distance apart in Y coordinates. Additionally, two objects meet the "easily combined" criteria if a bounding box of one object is positioned entirely within another object's bounding box, and if the objects have the same type.

If the objects can be combined easily, then step 136 is implemented, where the like objects are combined, and the process is complete at 146. This combination step is described in greater detail with respect to FIG. 6. If the objects cannot be combined easily, then the process checks in step 140 if sufficient storage is available in the appropriate collector to store the type and bounding box information of the new object. If there is sufficient storage, then the process adds the object to the collector in step 144, as detailed below. If there is not enough storage, then step 142 in implemented, in which a number of object combinations are forced to free storage in the collector. Combining objects frees storage, since two combined objects are treated as one object that requires only one set of type and bounding box information instead of two separate sets. The process of forcing object combinations is described in greater detail with respect to FIG. 7. After object combinations have been forced, storage is freed in the collector and step 144 is implemented.

In step 144, the type and bounding box of the new object is stored in the appropriate collector(s). After the object information has been added, the process is complete as indicated at 146.

Figure 6:
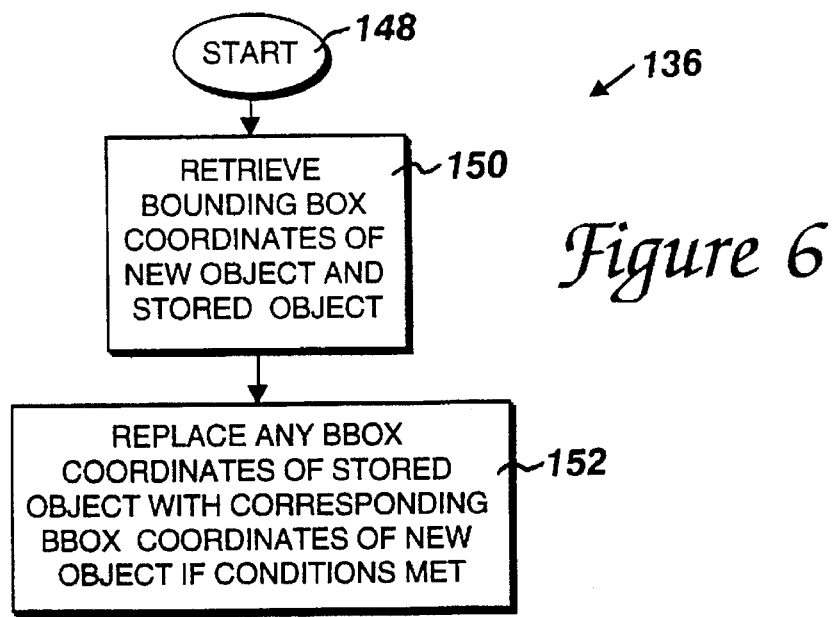
FIG. 6 is a flow diagram illustrating a step of FIG. 5 in which like objects in a collector are joined.

FIG. 6 is a flow diagram illustrating step 136 of FIG. 5, in which like objects are combined within a collector. The process begins at 148, and, in step 150, the bounding box coordinates are retrieved for the new object and the stored, "like" object. For example, in the described embodiment, a bounding box has four coordinates. The coordinates of the objects' bounding boxes can be specified as:

For the stored object:

$X_L$=X coordinate of left edge of bounding box $X_R$=X coordinate of right edge of bounding box $Y_T$=Y coordinate of top edge of bounding box $Y_B$=Y coordinate of bottom edge of bounding box and for the new object:

$X'_L$=X coordinate of left edge of bounding box $X'_R$=X coordinate of right edge of bounding box $Y'_T$=Y coordinate of top edge of bounding box $Y'_B$=Y coordinate of bottom edge of bounding box In next step 152, any bounding box coordinate of the stored object are replaced with the corresponding bounding box coordinate of the new object if predetermined conditions are met. In the described embodiment, these conditions are as follows:

Replace $X_L$ with the minimum of $(X_L, X'_L)$

Replace $X_R$ with the maximum of $(X_R, X'_R)$

Replace $Y_T$ with the maximum of $(Y_T, Y'_T)$

Replace $Y_B$ with the minimum of $(Y_B, Y'_B)$

Thus, a stored object's coordinate in the collector is replaced with a corresponding new object coordinate only if the new object has a smaller or larger coordinate, as appropriate. Once these replacements have been accomplished, the process is complete as indicated at 154.

Figure 4E:
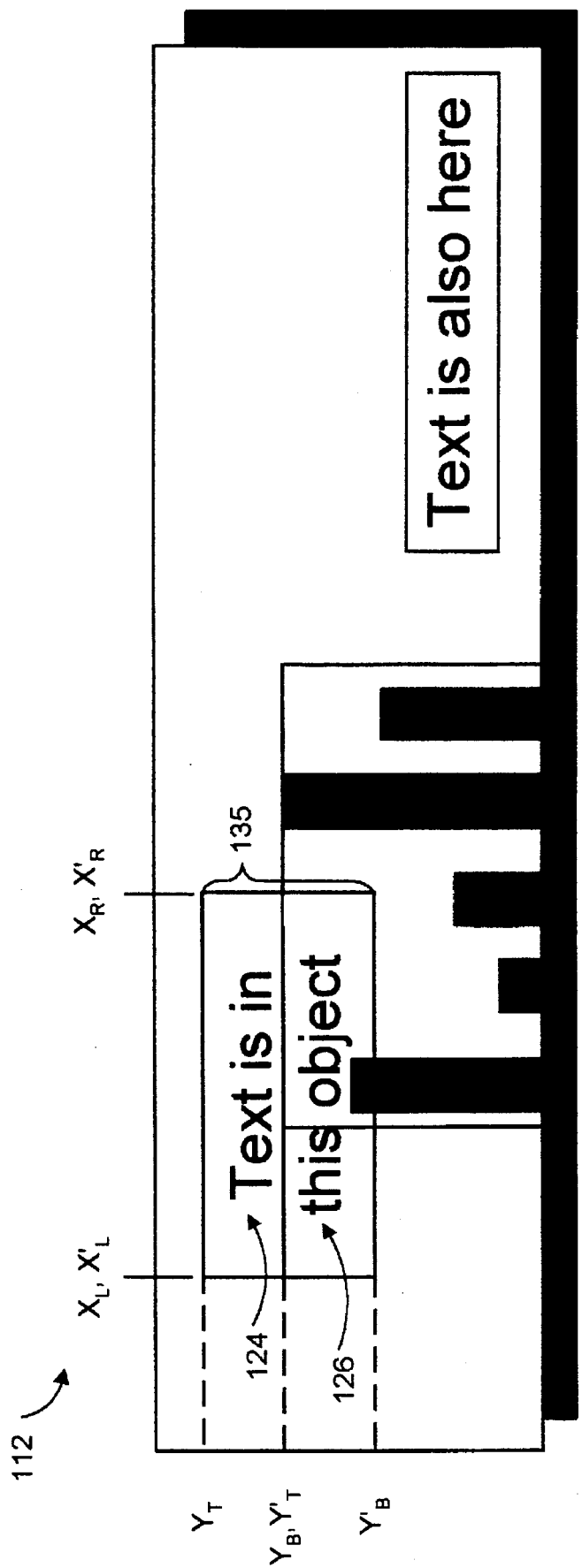
FIG. 4e is a diagrammatic illustration of a band including objects.

For example, in FIG. 4e, a band 112 of a page 110 is shown. Text object 124 has been previously stored in the collector of band 112. Text object 126 is a new object that is to be stored in the collector of band 112 as well. In step 134 of FIG. 5, new object 126 is found to be adjacent to text object 124 and has the same type (text) as object 124. Objects 124 and 126 therefore qualify as "like" objects, and are combined in the process of FIG. 6. Both objects have the same left and right (X) coordinates (i.e., $X_L = X'_L$, $X_R = X'_R$), and the bottom Y coordinate of object 124 is the same as or is nearly equal to the top Y coordinate of object 126. In step 152, coordinates $X_L$ and $X_R$ remain the same, coordinate $Y_T$ remains the same, and $Y_B$ is replaced by $Y'_B$. The new, combined object 135 thus has a bounding box having a left side at $X_L$, a top side at $Y_T$, a right side at $X_R$, and a bottom side at $Y'_B$.

Figure 7:
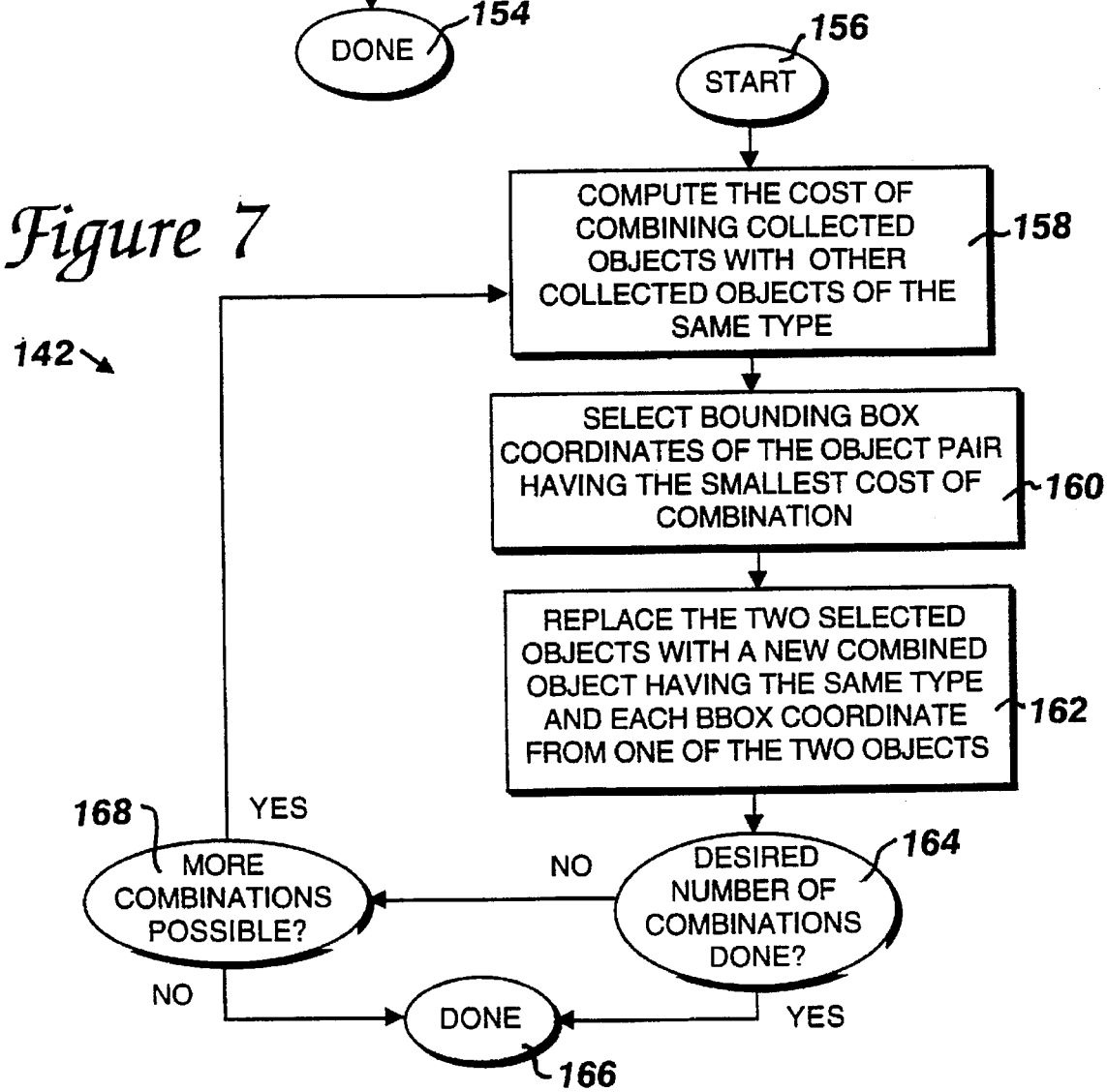
FIG. 7 is a flow diagram illustrating a step of FIG. 5 in which object combinations in a collector are forced to free storage.

FIG. 7 is a flow diagram illustrating step 142 of FIG. 5, in which a number of object combinations are forced to free up storage in the collector for the new object. Preferably, only objects of the same type are forced into combinations in this process 142. In the described embodiment, the number of combinations is an adjustable parameter that is greater than or equal to 1 which the user can set before the process of the present invention is implemented. For example, a minimum of 2 combinations can be selected. The minimum number of forced combinations can depend on the specific applications of the user.

The process begins at 156, and in step 158, the process examines stored objects having the same type in a collector for combining purposes. In one embodiment, each object's bounding box and type is compared to every other object's bounding box and type in the collector, which can be accomplished according to one of several well-known methods. For each collected object, the cost of combining the object with each other collected object of the same type is computed. The "cost" of combining two objects is dependent on the area of the resulting combined object, the separation distances between the objects, the sizes of each object, and even other parameters, such as time required to perform the combination, etc. An example of a cost function used for computing the cost of combining objects is as follows:

$$C = \alpha_1(A_u - A_p - A_q + A_i) + \alpha_2 \frac{A_u}{A_p + A_q} + \alpha_3 s_x^2 + \alpha_4 s_y^2$$

where $\alpha_1, \alpha_2, \alpha_3,$ and $\alpha_4$ are tuning parameters, $A_u$=the area of the bounding box that would result from doing the combination, $A_p$=the area of the first bounding box in the proposed combination, $A_q$=the area of the second bounding box in the proposed combination, $A_i$=the area of the intersection of the boxes that are proposed to be combined, $S_x$=the minimum separation of the boxes in the X direction (zero if X coordinates overlap at all), and $S_y$=the minimum separation of the boxes in the Y direction (zero if Y coordinates overlap at all).

This function provides the cost, C, which is used in later steps. The first term of the function provides all the area that would be included in the combined object which is not included in the original two objects, i.e., the extra whitespace that would have to be included. Preferably, as little whitespace as possible should be included in a combined object, since compressing whitespace is wasteful of time and memory (as explained below). The second term of the function is similar to the first but provides a ratio to compare areas. The third and fourth terms provide the separation of the two boxes is X and Y directions, respectively. The tuning parameters $\alpha_1$, etc. can be used to emphasize particular terms of the function. For example, if a user believes that the first term of the function (i.e. the $\alpha_1$ term) is more important in determining cost than the other terms, then the parameter $\alpha_1$ can be increased in value and the parameters $\alpha_2$, $\alpha_3$, and $\alpha_4$ can be lowered in value. A wide variety of other functions can also be used in other embodiments to provide a cost number reflecting these and/or other cost parameters.

In step 160, the process selects the bounding box coordinates of the object pair having the smallest cost of combination as computed above in step 158. The bounding box coordinates for the two objects are retrieved as described in step 150 of FIG. 6. In an alternate embodiment, in step 158, the cost of combining an object with another object can be calculated for different pairs of objects until a cost C of combination results that is less than or equal to a designated threshold. Thus, in step 160, the object pair that first met this threshold would be selected. This alternate method can save computing time over the embodiment described above, since costs of object combinations are calculated only until the threshold is met, not for all the object combinations in the collector.

In next step 162, the two selected objects are replaced with a new combined object having the same type as both the objects and having each bounding box coordinate from one of the two objects. The coordinates of the combined object are preferably determined using the method as described above in step 152 of FIG. 6. In step 164, the process checks whether the desired number of combinations have been completed. As explained above, a predetermined number of combinations can be set before the process begins. If the desired number of combinations has been completed, then the process is complete at 166. If not, then the process continues to step 168, where it is checked whether more combinations of objects are possible. More combinations are possible if there are at least two objects in the collector for at least one object type. If more combinations are possible, the process returns to step 158 to compute the cost for two objects having the same type as already computed, or for two objects have a type different from the type of any objects already combined. If no more combinations are possible, the process is complete as indicated at 166.

Figure 8:
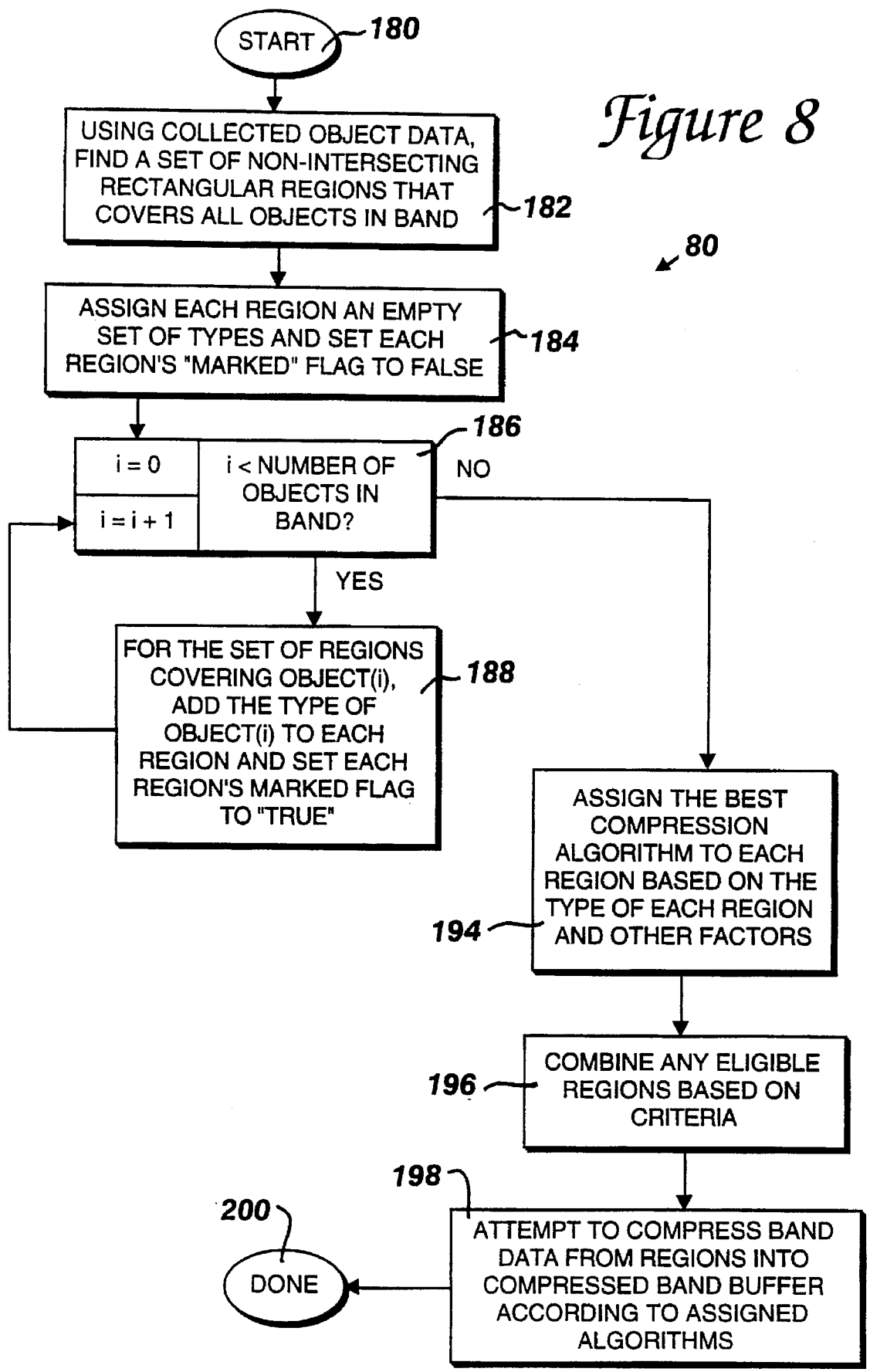
FIG. 8 is a flow diagram illustrating a step of FIG. 4b in which a band is compressed.

FIG. 8 is a flow diagram illustrating step 80 of FIG. 4b, where the process attempts to compress the data of band A. This is accomplished by dividing the band objects into non-intersecting regions, assigning compression algorithms to the regions, and attempting to compress the band, as described below. The process begins at 180. In step 182, a set of non-intersecting rectangular regions that covers all objects in the band is found. This is accomplished using the type and bounding box information stored in the collector associated with the band, and is described in greater detail below with reference to FIG. 9.

Figure 4F:
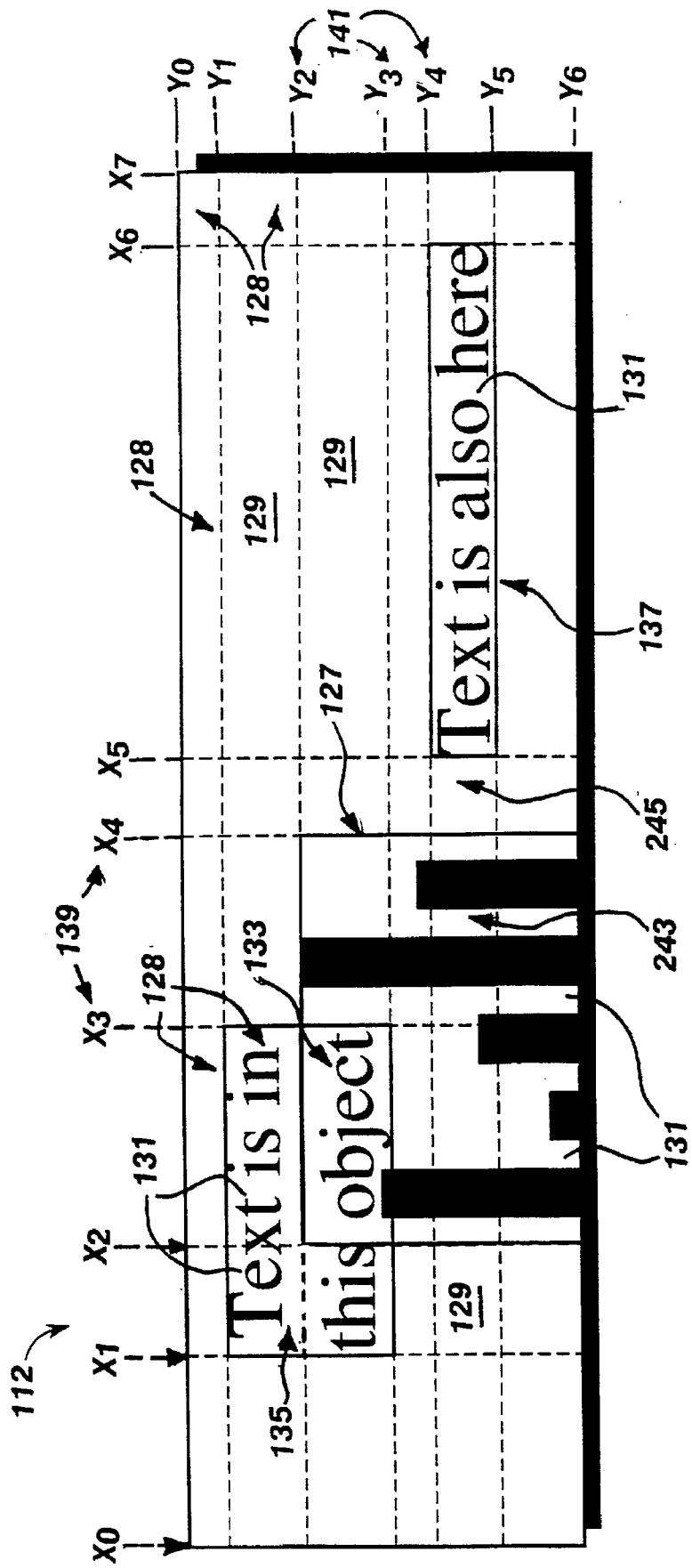
FIG. 4f is a diagrammatic illustration of the band of objects of FIG. 4e that has been partitioned into non-intersecting regions.

FIG. 4f is a diagrammatic illustration of band 112 of FIG. 4e being divided into non-intersecting regions. A number of non-intersecting regions 128 are provided over and surrounding objects 127, 135, and 137 as a result of step 182. A "region," as referred to herein, is a non-overlapping rectangular area in a band that "covers" (i.e. includes) some data portion of the band. Some of regions are empty regions 129, which include only whitespace and cover no objects (i.e., include no object data). Other regions 128 are non-empty regions 131, which cover one or more objects. All regions are preferably stored in a separate "region buffer" of memory (such as RAM 28). Each region is defined by a data structure which includes the coordinates of the region, the type(s) of the region, and other information as described below and with reference to FIG. 9a.

Referring back to FIG. 8, steps 184–188 assign object types to the non-intersecting regions 128 found in step 182. In initialization step 184, each region is assigned an empty set of types and each region's "marked" flag (also preferably stored in the data structure) is set to false. The marked flag is used to distinguish whether a region has an empty type or not. An empty type indicates that the region covers only whitespace and no objects in the band. In iterative step 186, a counter "i" is initialized to 0 and is compared to the number of objects in the band. Each object in the band is uniquely numbered and considered OBJECT(i). If i is less than the number of objects in the band, then step 188 is implemented.

In step 188, for the set of regions covering OBJECT(i), the type of OBJECT(i) is added to each covering region, and each region's marked flag is set to "true." Since non-intersecting regions that cover the objects were found in step 182, all regions in the band either cover an object with the entire area of the region, or do not cover an object at all. Only regions that cover OBJECT(i) are processed in step 188; the coordinate data stored in the region data structures 221 and X- and Y-arrays can be used to determine these covering regions. If the type of OBJECT(i) is the same as a type that is already stored in a covering region, then no new type is added to that region. A region may cover two or more types of objects and thus may be assigned two or more different object types over different iterations of steps 186–188; a region having more than one object type is considered to have a "complex" type. The "marked" flags of the covering regions are set to true, indicating that these regions have been marked with a non-empty type. The process can later examine the marked flag to distinguish regions that have non-empty types and regions that have empty types, where a "true" flag indicates the region has a non-empty type.

For example, in FIG. 4f, region 133 covers both text object 135 and graphics object 127. For example, object 135 is OBJECT(1) (i.e., i=1) and object 127 is OBJECT(2) (i.e., i=2) in the loop of iterative step 186. Region 133 is a region covering a portion of OBJECT(1) and a portion of OBJECT (2). Thus, the type of OBJECT(1) (i.e., text) will be added to region 133 when i=1, and the type of OBJECT(2) (i.e., graphics) will be added to region 133 when i=2. Region 133 therefore has both text and graphics types, i.e., a "text-graphics" complex type.

After step 188, the process returns to step 186 to increment counter i to the next object in the band. Step 188 then processes the regions covering the next OBJECT(i). Once every object has had each covering region processed, then i will be greater than the number of objects in the band in step 186. The process then continues to step 194, where a "best" compression algorithm is assigned to each region based on the type of each region and other factors. The "best" compression algorithm for a region is estimated to produce the best compression ratio for the combination of object types included in the region without sacrificing the quality of the displayed image derived from the region. Preferably, algorithms are assigned based on the current compression level and the type of the region.

In the preferred embodiment, algorithms to assign to regions are referenced in tables stored in memory, as described below with reference to FIGS. 8a and 8b. The current compression level and object types of a region are provided to the tables to retrieve the corresponding "best" algorithm for that region. User constraints of quality and desired compression ratio can also help determine the assigned algorithm using these tables. For example, a compression algorithm that provides excellent visual quality for one of multiple types of a region may not achieve a sufficient compression ratio for the other type. There thus may be a tradeoff between visual quality and compression ratio for different types (such as text and image types) which can be determined by user constraints. The compression algorithm assigned to a region is preferably stored in the data structure of that region, as shown below in FIG. 9a.

In other embodiments, other constraints can help determine which compression algorithms are assigned, especially for regions having combined (multiple) types such as text and graphics or graphics and image. User constraints can include overall page characteristics and time to compress (or decompress) the region. Constraints of overall page characteristics can determine whether similar algorithms are to be used over the entire page to provide a uniform quality image, or can determine a particular minimum compression ratio to be used over the entire page based on the available storage space for the entire page. The process can examine different compression ratios of bands and/or regions of the page that have been compressed, and can estimate ratios for bands yet to be compressed by examining data in collectors and in the band record. For example, a region can be assigned the same compression algorithm as a region across a band boundary. The time to compress or decompress a region can be different depending on the algorithm used and may be of concern to a user in a particular application.

In an alternate embodiment, a region having a complex object type can be assigned a single type, where the single type is one of the types of the region. In such an embodiment, for example, the commands associated with an input object (received in step 64 of FIG. 4a) could include information on how the object is displayed in relation to other objects. For example, the input object data could include information specifying if each object is transparent or opaque when displayed, and the "layering" of the objects on the screen, i.e., which objects are displayed over other objects. Using this information, step 194 can determine which single object type should be assigned to a region having a complex type based on the layering and transparency of the objects.

In next step 196, the regions are examined and any eligible regions are combined with other regions based on specified criteria. These combinations are accomplished primarily to reduce storage space requirements of the regions according to, for example, limitations of hardware implementing the process. The combination of regions in this step is described in greater detail below with respect to FIG. 10. In next step 198, the regions of the current band are attempted to be compressed into the compressed band buffer according to the assigned algorithms for the regions. Different compression algorithms can be used on different object types in a band to store rasterized bitmaps in relatively small storage space compared to the storage space needed if no compression or if a single compression algorithm were used. The steps of compressing the regions and storing them in the compressed band buffer is described in greater detail with respect to FIG. 12. As explained above with reference to FIG. 4b, the band data may not fit in the available space in the compressed band buffer. After the band is attempted to be compressed, the process is complete as indicated at 200.

It should be noted that, in the described embodiment, the assigning of a compression algorithm to objects (step 194) and object combinations (step 196) are performed on rasterized object bitmap data in the uncompressed band buffer. Alternatively, compression algorithm assignments and object combinations can be assigned before objects are rasterized and stored in the uncompressed band buffer, such as before step 78 of FIG. 4b. Also, assigning algorithms and combining can be performed at any time after the band display list has been built but before performing the actual compression of the band.

FIG. 8a shows an example of an algorithm look-up table that can be used to provide algorithm assignments to a region in step 194 of FIG. 8. In the described embodiment, the algorithm look-up table is stored in ROM 30 and can be utilized in conjunction with indexing table 205 (described below) to determine what combination of available compression algorithms to assign to a region. A number of algorithm entries 201 is provided in table 202, where each algorithm entry 201 includes an identifier 212, one or more specified compression algorithms 203, and compression parameters 204. Preferably, an algorithm entry 201 is accessed using algorithm identifier 212, and the algorithm(s) 203 and parameters 204 are then provided and assigned to the region. For example, if algorithm entry 1 is accessed, then the compression algorithm LZW is to be assigned with the corresponding parameters listed in field 204. If algorithm entry 5 is accessed, then the compression algorithm LZW is to be cascaded with a Differential Pulse Code Modulation (DPCM) process and assigned with the parameters in field 204. Cascaded algorithms operate by "pre-processing" the data using one algorithm (such as DPCM), and then compressing the pre-processed data with the other algorithm (such as LZW). Cascaded algorithms can be used to achieve different compression ratios than when using an algorithm alone. The algorithm entries 201 are accessed by the indexing table 205, described below with reference to FIG. 8b.

Some algorithm entries 201 have the same algorithms listed in field 203 but have different parameters listed in field 204. Compression parameters are provided to adjust the compression process, and are well known to those skilled in the art. For example, in a DCT-based algorithm, a set of quantization coefficients, a threshold to shift coefficients, etc., can be specified; in LZW, a pointer width can be specified; etc. Different parameters can provide different compression ratio and compression qualities to different algorithm entries. For example, algorithm entry 1 assigns LZW with PARAMETERS 1, while algorithm entry 3 assigns LZW with PARAMETERS 3. Entry 1 may compress text at one compression ratio and quality, while entry 3 may compress text at a different compression ratio and quality.

It has been found that certain compression algorithms compress certain types of regions more efficiently than other types of algorithms. Thus, the described embodiment as shown in table 202 provides the LZW compression algorithm for text regions, the LZW compression algorithm for graphics regions, and a discrete-cosine-transform based (DCT-based) compression algorithm (such as JPEG) for image regions. A Pixel Depth Reduction (PDR) algorithm can also be provided for cases when a deterministic compression ratio is needed, i.e., a compression ratio that is exactly known prior to compressing (other types of compression ratios are estimated). These algorithms, or cascaded multiple algorithms, can also be assigned to complex object types depending on user constraints, as described below. Other standard compression algorithms, such as Wavelet, RLE, Huffman, etc., or even non-standard algorithms, can be assigned to different object types and quality levels. Other types of algorithms can be cascaded, as well. For example, LZW or Huffman coding can be cascaded with a Run-Length Encoding (RLE) algorithm. The implementation of these compression algorithms (and decompression of data compressed with these algorithms) is well-known to those skilled in the art.

FIG. 8b shows an example of an indexing table 205 which can be used in step 194 of FIG. 8 to assign an algorithm entry 201 (as shown in table 202 in FIG. 8a) to each non-empty region of the current band. Indexing table 205 is stored in ROM 30 (or RAM 28) and can be utilized to assign an algorithm entry 201 according to object type and compression level. Indexing table 205 includes entries for different combinations of object types 206, which are text, graphic, and image in the described embodiment. For each possible non-empty combination of object types, there is an entry group 207. Thus, there are seven different entry groups 207 in the described embodiment, one group for each non-empty combination of three object types.

Each entry group 207 includes one or more index entries 213. In the table 205, three entries 213 are shown in each entry group 207, but any number of entries 213 can be included in other embodiments. An entry 213 points to an algorithm entry 201 in algorithm table 202 which is to be assigned to a region. Preferably, each entry includes three fields: an algorithm entry field 211, a quality field 208, and a compression ratio field 209. The algorithm entry field 211 stores a pointer (such as an identifier) to an algorithm entry 201 in the algorithm table, which is described above in FIG. 8a. This pointer provides the actual compression algorithm or (cascaded) algorithm combination to be assigned to a region. The quality field 208 indicates the estimated quality (or lossiness) of compressed data when compressing the region using the algorithm entry in field 211. In the described embodiment, the quality field indicates the minimum current compression level that is required to assign the algorithm entry in field 211 to a region. The current compression level is determined above in steps 54 and 94 of FIGS. 4a and 4c. The compression ratio field 209 indicates the estimated resulting compression ratio when compressing the region using the algorithm entry in field 211. For example, a compression ratio of "2" indicates that the data is estimated to be compressed at a 2:1 ratio. Typically, the greater the required compression level (worse quality) in field 208, the more lossy the algorithm and the greater the compression ratio in field 209.

Any one entry 213 in entry group 207 may be selected for a region if the region meets the constraints of object types 206 and compression level 208 for that entry 213. In addition, constraints of compression ratio may also be used to select an entry 213 in a group 207 for a region.

For example, if a region R has an object type of text only, then the process examines the object types 206 and selects group 207a which corresponds to the object type "text." Three index entries 213a, 213b, and 213c are included in group 207a. Assuming the current compression level is 1, only the first entry 213a can be selected, since its quality field is 0, and only entries having a quality field 208 less than or equal to the current compression level can be selected. The first entry 213a includes a pointer 211 to algorithm entry 1 in table 202 of FIG. 8a and indicates in field 209 that the estimated compression ratio for algorithm entry 1 is 2.0. Algorithm entry 1 provides a LZW algorithm (and parameters) to be assigned to region R, which is suitable for text compression.

If the current compression level were 2 in the above example, then either the first entry 213a or the second entry 213b could be selected for region R. Entry 213a provides a compression ratio of 2.0, and entry 213b provides a compression ratio of 5.0. Thus, user constraints can dictate which entry to select. If higher quality is desired, then entry 213a can be selected; if higher compression ratio is desired, then entry 213b can be selected. If region R has a complex type, such as text-image, then an entry 213 from group 207b would be selected in a similar fashion.

Figure 9:
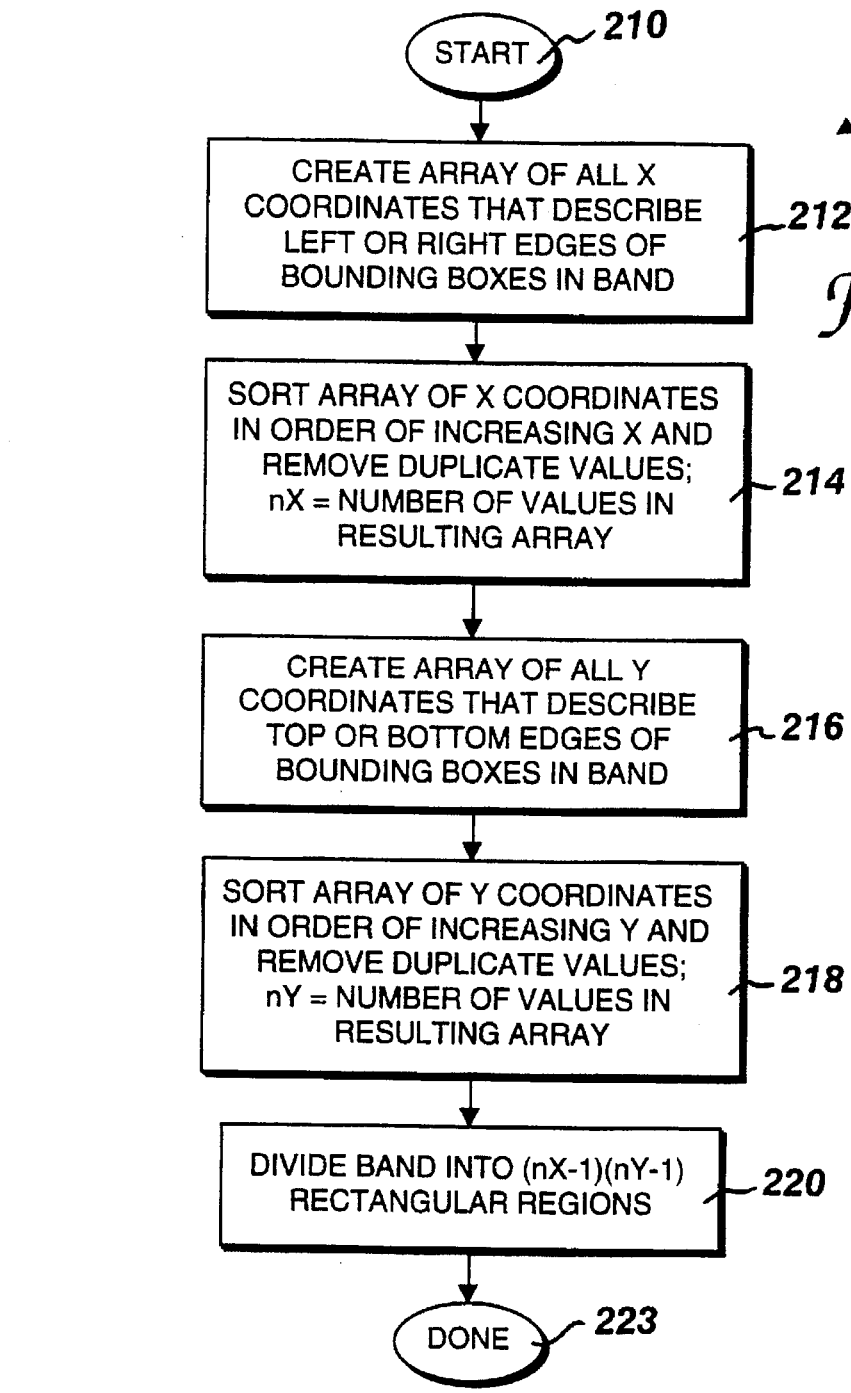
FIG. 9 is a flow diagram illustrating a step of FIG. 8 in which non-intersecting rectangular regions are designated in the band to be compressed.

FIG. 9 is a flow diagram illustrating step 182 of FIG. 8, in which a set of non-intersecting rectangular regions that covers all objects in the current band is found. The described process of FIG. 9 is only an example, since there are many possible methods to provide non-intersecting regions from object bounding boxes. The process begins at 210, and, in step 212, an X-array is created having all X coordinates that describe left or right edges of object bounding boxes in the band. The left and right edges of the band are also included as X coordinates in the X-array. For example, X coordinates 139 as shown in FIG. 4f are stored in the X-array.

In step 214, the X-array is sorted in the order of increasing X coordinates, and duplicate X coordinate values are removed from the array. The resulting array thus includes nX values. In step 216, a Y-array is created having all Y coordinates that describe top or bottom edges of object bounding boxes in the band. The top and bottom edges of the band are also included as Y coordinates in the Y-array. For example, Y coordinates 141 as shown in FIG. 4f are stored in the Y-array. In step 218, the Y-array is sorted in the order of increasing Y coordinates, and duplicate Y coordinates are removed from the array.

Finally, in step 220, the band is divided (or "partitioned") into $(nX-1)(nY-1)$ rectangular, non-intersecting regions. Each region can be labelled as $R_{i,j}$, where $0 \leq i < nX-1$ and $0 \leq j < nY-1$. The extent of the coordinates (X,Y) of region $R_{ij}$ is thus $X_i \leq X < X_{i+1}$ and $Y_j \leq Y < Y_{j+1}$, where $X_i$ is the ith X coordinate in the X-array $(0 \leq i < nX)$, and Yj is the jth Y coordinate in the Y-array $(0 \leq j < nY)$. Note that, since discrete pixels are being displayed, two regions do not have the same coordinates on an adjacent edge. Thus, one region would have a right edge X coordinate of $X_i-1$, and an adjacent region to the right would have a left edge X coordinate of $X_i$. The process is then complete at 223.

Figure 9A:
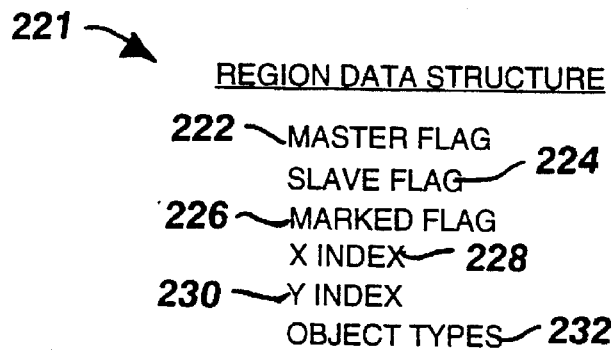
FIG. 9a is a diagrammatic illustration of a data structure describing a region of FIG. 9.

As shown in FIG. 9a, each region $R_{i,j}$ created in step 220 preferably includes a data structure 221 stored in the region buffer. The region data structures are preferably ordered in "raster display order" (i.e. scan line order) in the region buffer according to the top left corners of the regions so that the decompressor can retrieve the regions in this order, as described below with reference to FIG. 13. The data structure 221 of the described embodiment includes a number of fields which include master flag 222, slave flag 224, marked flag 226, X index 228, Y index 230, and object types 232. Other forms of data structure 221 can be used in other embodiments. Master flag 222 and slave flag 224 are used to implement region combinations, and are detailed below with respect to FIGS. 10 and 11. Marked flag 226 is used to mark whether a region has a non-empty type or an empty type (true or false, respectively), as described above.

X index 228 and Y index 230 describe the location of the region in terms of indexes (offsets) into the X-array and Y-array, respectively, and preferably range from 0 to the number of regions in their respective directions. These indexes specify a region by the region's lower left coordinates. For example, an (X index, Y index) of (1, 2) specify the region $R_{1,2}$, which is second from the left edge of the band and third from the top edge of the band; the coordinates of region $R_{1,2}$ range from the second X coordinate in the X-array to the third coordinate in the X-array (minus 1), and from the third Y coordinate in the Y-array to the fourth Y coordinate in the Y-array (minus 1). These indexes apply when the region is neither a master or slave. If the region is a master, X index 228 indexes the coordinates of the diagonally opposite slave region. If the region is a slave, the X and Y indexes 228 and 230 index the coordinates of the slave's master region.

Object type field 232 specifies all the object types which the region covers. In the described embodiment, this is implemented as a series of bits, where one bit is included for each possible object type (not including the "empty" type). If a bit is on for a certain type, then the region covers an object of that type. Data structure 221 also stores other information needed for compression/decompression of the regions, such as the location of the region in the uncompressed band buffer and general parameters such as pixel depth and number of pixels on a scan line for the region, which are used by the compression process as described with reference to FIG. 12.

Note that other methods can be used in alternate embodiments to provide a set of non-intersecting regions that cover the band. For example, a method utilizing linked lists instead of the preferred coordinate array method described above can be used. In the linked lists method, each region can initially correspond to each object (as specified in the collector for the band) and can have a data structure including a bounding box and type description. Each of these region data structures can be included in a linked list, as is well known to those skilled in the art. If two regions intersect each other, then those regions are removed from the linked list and are divided into non-intersecting regions, and these non-intersecting regions are inserted into the linked list in place of the intersecting regions. Methods of manipulating linked lists as such are well known to those skilled in the art. Each two adjacent regions in the linked list can be similarly examined and replaced with non-intersecting regions when appropriate.

Figure 10:
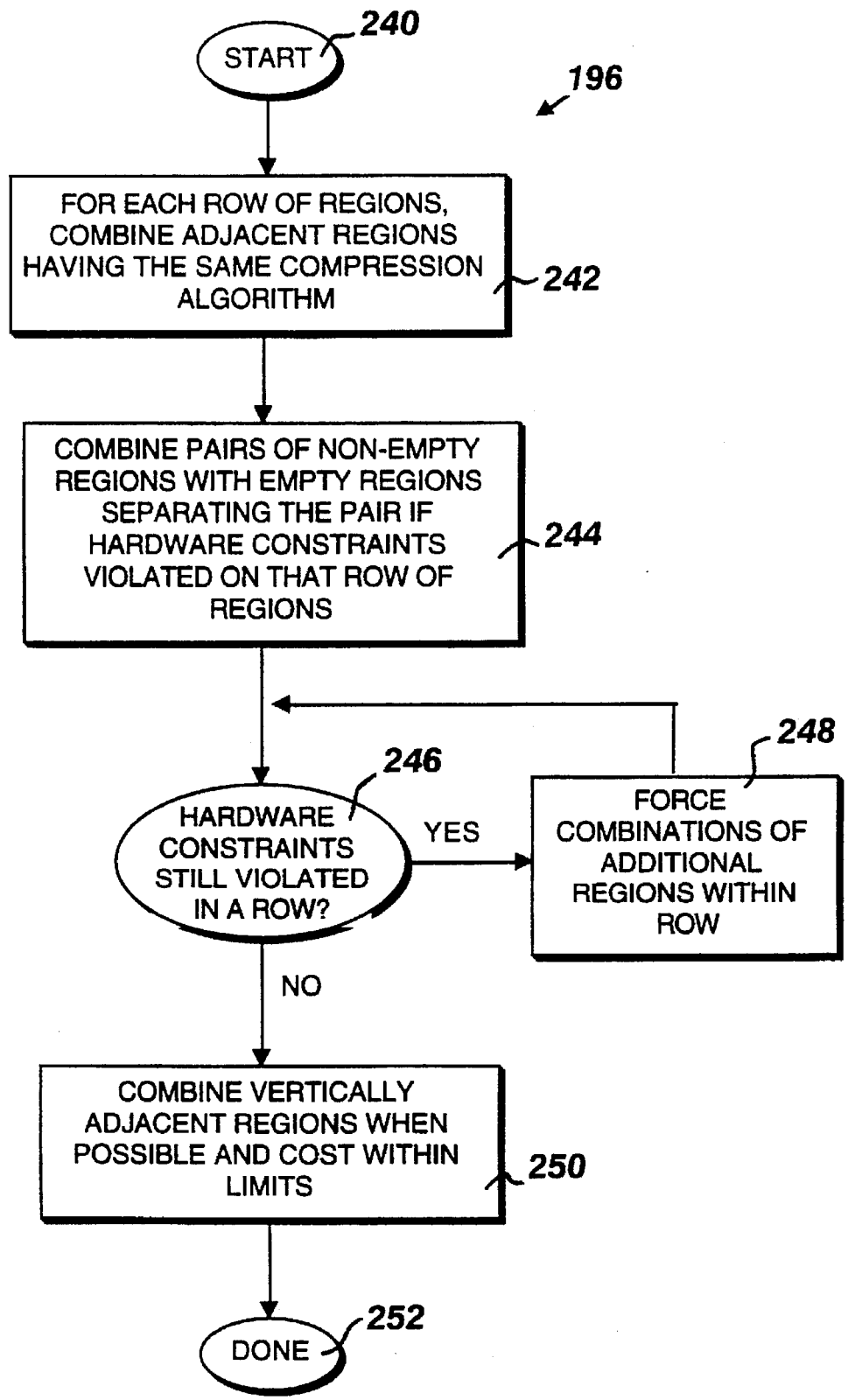
FIG. 10 is a flow diagram illustrating a step of FIG. 8 in which eligible regions are combined.

FIG. 10 is a flow diagram illustrating step 196 of FIG. 8, in which regions are combined based on specific criteria. The process begins at 240, and, in a step 242, each row of regions is examined. A "row" of regions refers to all the regions in a horizontal row of the band (those regions having the same Y coordinates). A region's assigned algorithm is preferably compared to the assigned algorithms of the regions to the left and to the right of that region. In each row, adjacent regions that have been assigned the same compression algorithm are combined. Two regions can be considered "adjacent" if there are no intervening regions between the two regions. A method for combining regions is described in greater detail with respect to FIG. 11. Preferably, two regions are combined, and the combined region can then be combined to additional adjacent regions if the algorithms are the same. This is the least "costly" combination of regions that can be accomplished, since no compromises in quality are made and storage space is saved. Thus, this combination is preferably performed prior to other region combinations, which are detailed below.

In next step 244, pairs of non-empty regions having the same assigned compression algorithms are combined with empty regions separating the pairs if hardware constraints are violated on that row of regions. The hardware constraints of the described embodiment typically include a limit to the number of regions that can exist on a horizontal scan line. This limit is dictated primarily by the amount of available memory, e.g., in the ASIC 38. Thus, if there are more regions in a row than the limit allows, the hardware constraints have been violated. In step 244, intervening empty regions are included in a combined region to reduce the number of regions in a row, since all adjacent regions with like compression algorithms were already combined in step 242. For example, as shown in FIG. 4f, if region 243 were assigned the same compression algorithm as region 137, and it was determined that there were too many regions in that row of regions, then the pair of regions 243 and 137 would be combined with empty region 245 to form a combined region. The method of combining regions is described in greater detail with respect to FIG. 11. Again, combined regions can continue to be combined with additional regions if the required conditions are met. The combinations performed in step 244 are more "costly" than the combinations of step 242, since empty whitespace (background) data is being included in a region. This causes empty space to be compressed and stored in the compressed band buffer, which is inefficient. Ideally, only regions having object data and no empty space are desired so that only object data is compressed into the compressed band buffer.

In next step 246, the process checks whether the hardware constraints are still violated in any row of regions in the current band. If so, then step 248 is implemented, in which additional region combinations are forced within the violating row. Preferably, regions having a small "cost" of combination are combined first. This forced region combination cost is preferably based on the estimated amount of compressed storage required for the combined regions in excess of the estimated amount of compressed storage required for the individual regions. For example, if two regions R1 and R2 are estimated to require B1 and B2 bytes of storage, respectively, when separately compressed, and are estimated to require B bytes when combined and compressed, the cost of the combination is B−(B1+B2). This cost can sometimes be negative, since there is a certain amount of incompressible storage "overhead" associated with each region; combining the regions allows the overhead to be shared in one combined region.

In this step 246, even regions having different assigned compression algorithms may have to be combined in order to reduce the number of regions. Thus, this step has the most costly and least desirable type of region combinations, since some object types may not be compressed with an efficient algorithm as a result. If necessary, algorithm assignments can be changed if regions having two different types are combined. For example, if a text and image regions have to be combined in this step, then the assigned compression algorithms can be changed to an algorithm that provides better quality to a text-image complex object type. The region combinations can be performed as described with reference to FIG. 11.

After step 248, the process returns to step 246 to check if hardware constraints are still violated on any row of the band. If they still are, then step 248 is repeated as often as necessary. Once the hardware constraints are no longer violated, step 250 is implemented, in which vertically adjacent regions are combined when possible and when the "cost" is within limits. The "cost" here may be specified similarly as in step 246. The vertical combinations are accomplished as described with reference to FIG. 11. The vertical combinations are preferably accomplished after all horizontal combinations are completed in steps 242, 244, and 248.

Figure 11:
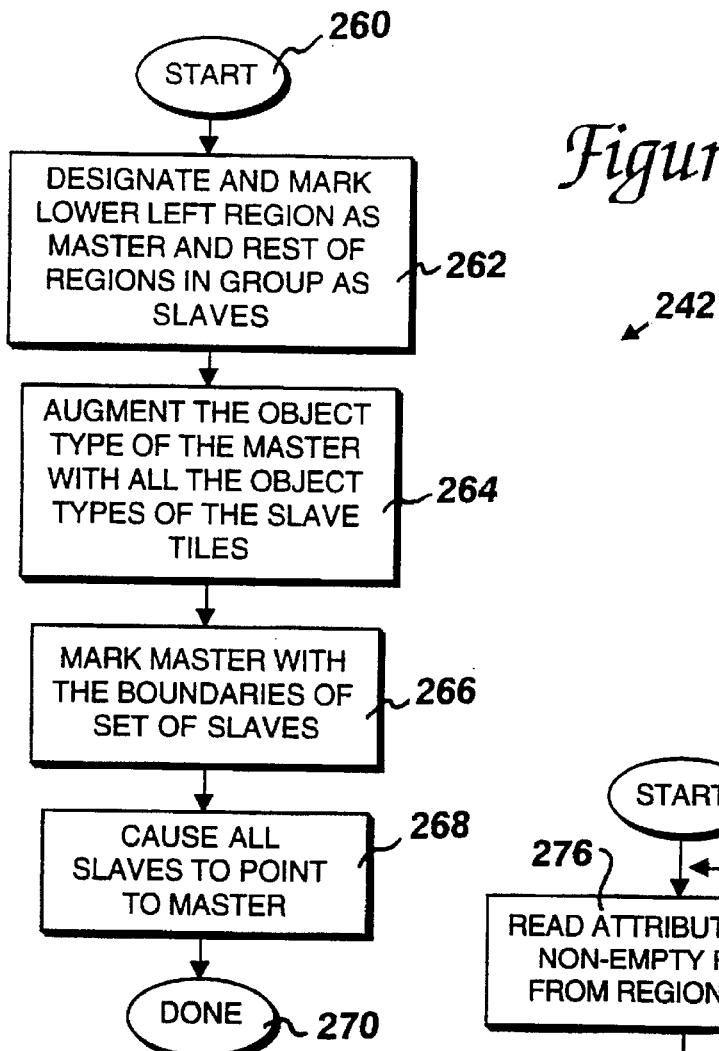
FIG. 11 is a flow diagram illustrating steps of FIG. 10 in which regions are combined.

FIG. 11 is a flow diagram illustrating the method of combining regions in steps 242, 244, 248, and 250 of FIG. 10. It is assumed that a group of two or more regions are desired to be combined. The method starts at 260, and in a step 262, the lower left region of the group of regions is designated the master region. The rest of the regions in the group are designated slave regions of the master region. This is accomplished in the data structure 211 of FIG. 9a by setting the master flag to true for the master region and setting the slave flag to true for each of the slave regions.

In step 264, the object type of the master region is augmented with all the object types of the slave regions. In the described embodiment, this is accomplished by setting the bits in the object type field 232 of the master region to all types included in the slave regions. Any duplicate object types are ignored. In step 266, the master region is marked with the boundaries of the set of slave regions. In the preferred embodiment, the master region's X-index and Y-index are set to the indexes of the slave region furthest diagonally opposite to the master region (i.e., the slave region that is furthest to the right and above the master). In step 268, each slave region is set to point to the master region. In the data structure 221 of FIG. 9a, this is accomplished by setting the X-index and Y-index of each slave to the indexes of the master region.

For example, if two horizontally adjacent regions are to be combined, the leftmost region is the master and has an X-index and Y-index of the slave region on the right (that slave region is considered diagonally opposite to the master). The region to the right is the slave region and has an X-index and a Y-index of the master region. Since the slave includes the location (coordinates) of the master, and the master includes the location (coordinates) of the opposite slave, the entire area of the combined region is known. Note that, in other embodiments, other methods of combining regions can be used.

Figure 12:
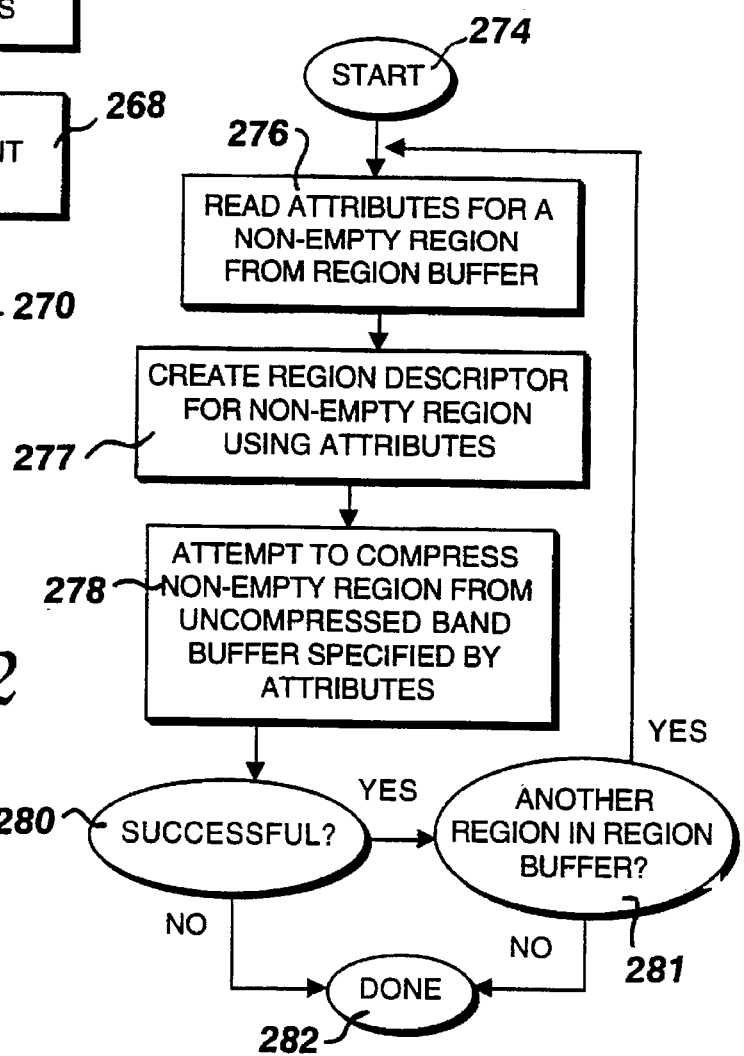
FIG. 12 is a flow diagram illustrating a step of FIG. 8 in which a band is attempted to be compressed.

FIG. 12 is a flow diagram illustrating step 198 of FIG. 8, in which the band is attempted to be compressed into the compressed band buffer according to the assigned algorithms in the band. The compression can be implemented by ASIC 38, or, alternatively, by a software process. The process starts at 274, and, in step 276, the attributes for a selected non-empty region in the band are read from the data structure 221 in the region buffer. The "attributes" for a region include relevant information stored in the region's data structure used for compressing the region. This includes the identification of the compression algorithm assigned to the region, the location of the region in the uncompressed band buffer, the size of the region, the width of a scan line, pixel depth (number of bits in a pixel), etc. In the described embodiment, the first region data structure in a scan line order of data structures is first retrieved from the region buffer and its associated region compressed, followed by the next region in scan line order. The scan line order is the raster display order in which a scan line pointer displays pixels on an output display device, as described below in FIGS. 13 and 13a. The scan line order of regions preferably starts with the region at the top left of a band (determined by the top left corner of each region), followed by the next region to the right, and so on in a left-to-right, top-to-bottom order. In addition, the region data structures do not have to actually be stored in the region buffer in the scan line order; they can, for instance, be linked in the scan line order with linked lists, as is well known to those skilled in the art. Regions can be retrieved and compressed in other orders in alternate embodiments.

In step 277, a "region descriptor" record is created for the region selected in step 276 and is stored at the beginning of each compressed band in the compressed band buffer (some information in the region descriptor is added after compressing the region in step 278). The region descriptor may be linked with other region descriptors for other regions in the band, preferably in raster display order. The region descriptors can be used in the compression and decompression processes, for example, by ASIC 38. Each region descriptor preferably includes the height H (in pixels) and width W (in pixels) of the associated region, the location (e.g., coordinates) of the region on the page, pointer to the starting location of the region in the uncompressed band buffer such as a byte offset (used when compressing), pointers to the location of the region in the compressed band buffer, such as a byte offset from the beginning of the band (stored after compressing the region and used when decompressing), pointers to the compression algorithm(s) used to compress the region, and general parameters such as pixel depth and number of pixels on a scan line for the region. This information can be determined from the attributes retrieved from the region data structure 221 and other system parameters. In other embodiments, the region descriptors can be stored in other areas besides the compressed band buffer, or can be created before the actual compression process.

In step 278, the "compressor" (i.e., a processor and/or any related software implementing the appropriate compression algorithm) attempts to compress a non-empty region in the uncompressed band buffer using attributes from the region descriptor. The compressor attempts to compress the data for the current region from the uncompressed band buffer using the assigned compression algorithm and stores the compressed data in the compressed band buffer.

This compressed data may or may not fit in compressed band buffer, as described above with reference to FIG. 4b. If the compression is not successful, i.e., the compressed data overflows the available storage space, the process is complete at 282. If the compression is successful, then the compressed region is marked as "compressed" in the "band record"; also, the starting location of the band in the compressed band buffer and the current compression level are stored in the band record. Step 281 is then performed, in which the process checks if another region is available to be compressed. If another non-empty region is available in the region buffer, then the process returns to step 276 to read attributes and compress the next region. If another non-empty region is not available from the region buffer, then the process is complete as indicated at 282.

It should be noted that only non-empty regions are compressed and stored in the compressed band buffer. Empty regions in the band, i.e., "background" areas or pixels (whitespace), are not compressed or stored, since these regions do not include any object data. The present invention thus saves storage space and compression time by compressing and storing only the portions of a page including object data. Background areas can be displayed with the desired attributes (brightness, color, etc.) at the time of decompression and/or display, as described below with respect to FIG. 13.

The present invention thus implements multiple compression algorithms to reduce the storage space required by the rasterized data while maintaining good visual quality when displaying the data. These compression algorithms have been optimized to the type of data being compressed in view of several constraints as described above. Well-known compression algorithms typically can compress one type of object efficiently; the method of the present invention allows all types of objects to be compressed with a much greater reduction in required storage space at acceptable quality than if a single compression algorithm were used for all object types.

Figure 13:
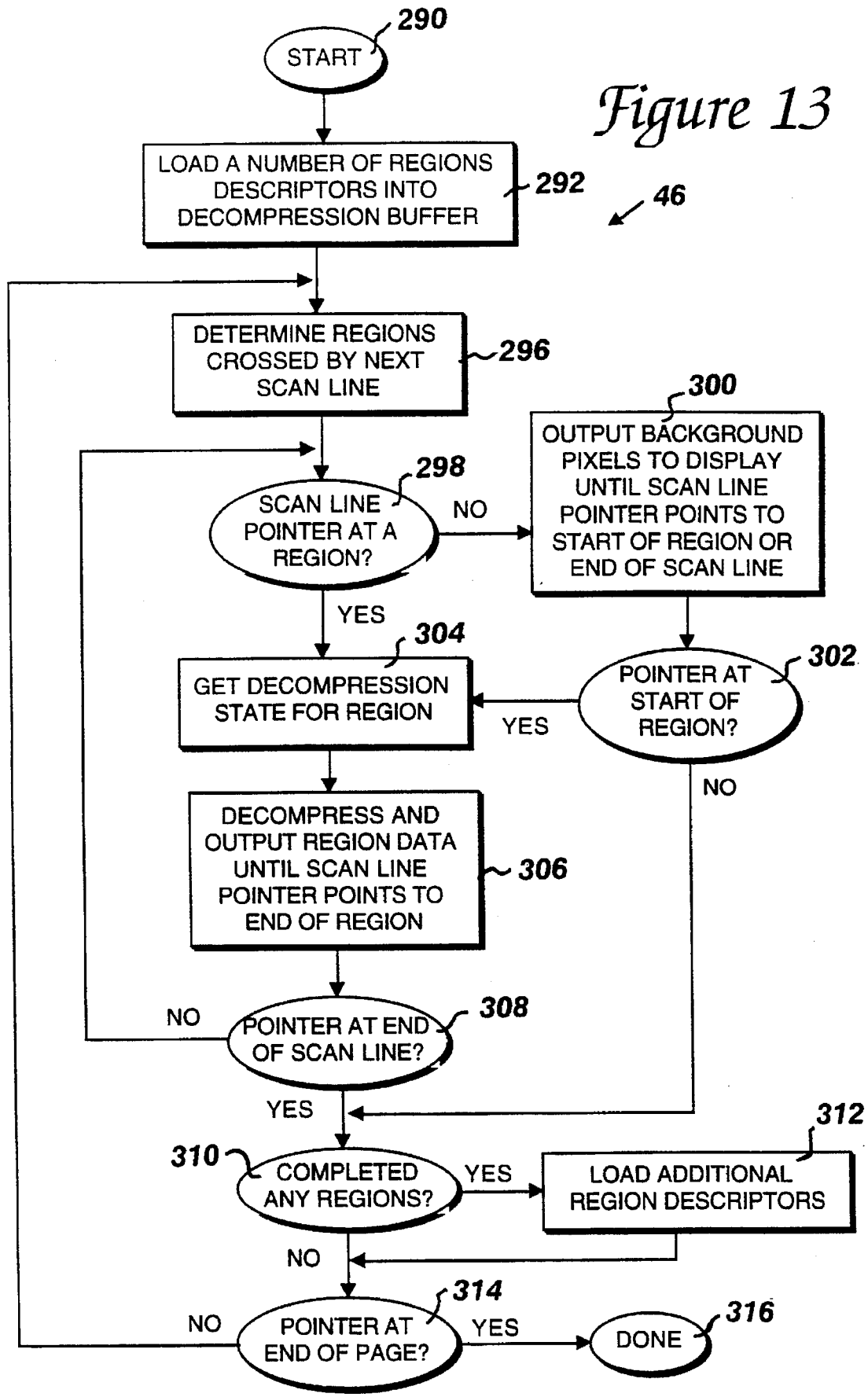
FIG. 13 is a flow diagram illustrating a step of FIG. 3 in which the compressed data is decompressed and displayed.

FIG. 13 is a flow diagram illustrating step 46 of FIG. 3, in which the compressed data is decompressed based upon the assigned compression algorithms and the decompressed data is displayed. In one embodiment, the decompression method 46 is implemented by hardware such as ASIC 38 as shown in FIG. 2a. Alternatively, decompression can be implemented in software.

The process begins at 290. In step 294, a number N of "region descriptors" (or a similar list of regions) are retrieved from the beginning of band(s) of data in the compressed band buffer for the current displayed page of data. The region descriptors are described with reference to FIG. 12 and are retrieved in the same order that their associated compressed regions are stored. The retrieved region descriptors are stored in a "decompression buffer," which can be included in ASIC 38, for example. The number N of retrieved region descriptors can vary in different embodiments. Preferably, N is at least one more than the maximum number of regions that can be provided on a single row or horizontal scan line as described above with reference to FIG. 10. This is desired so that at least one region descriptor is still in the decompression buffer when the end of a band is reached, as described below.

Next, the process determines the regions crossed by the next scan line in step 296. The first time this step is implemented, the "next" scan line is the first horizontal scan line at the top of the page. A "scan line", as referred to herein, is a horizontal line on the page that is traced from left to right (described with reference to FIG. 13a). This is the typical direction of displaying pixels in raster output devices, and the data is typically provided to the output devices in the scan display order. Depending on the embodiment, scan lines can also be implemented as horizontal right-to-left lines, vertical, up-to-down lines, etc. Thus the terms "left", "right", "top", "horizontal", "vertical", etc. refer to left-to-right, top-to-bottom scan lines and may be changed appropriately in other embodiments. The next scan line is traced across the width of the displayed page to determine if any regions on the page are crossed by the current scan line. This can be accomplished by examining the height and width of regions and the location of regions on the page as provided in the region descriptors.

In next step 298, the processor checks if a scan line pointer is currently within or at the left border of a region. The scan line pointer is the "front" of the scan line as it is traced across the width of the page in a displaying process. When first implementing these steps, the scan line pointer preferably starts at the top left corner of the page (the page can be oriented in any direction). The scan line pointer can either be within a non-empty region or within an empty region; the empty regions are referred to herein as "background" areas or background pixels. The background areas were not compressed and stored in the compressed band buffer, since there is no object data to store for these areas.

If the scan line pointer is not within or at the left border of a non-empty region in step 298, step 300 is implemented, in which background pixels on the current scan line are sequentially output to the display as the scan line pointer is moved left to right. When the scan line pointer reaches the starting (left) border of a region, or the end of the current scan line, no more background pixels are output (until the scan line pointer moves to another background area). The background pixels can be "whitespace" pixels, such as the white background of a white sheet of paper. Preferably, any attribute, such as color, brightness, etc., of background pixels can be specified by the user for whitespace pixels.

After step 300, the process checks whether the pointer is at the start of a region in step 302. If so, then step 304 is implemented, as described below. If the pointer is not at the start of a region in step 302, then the pointer is at the end of a scan line. Step 3 10 is then implemented, as described below.

Once the scan line pointer points to a region, either in step 298 or after displaying background pixels in step 300, then step 304 is implemented, in which the decompression "state" is retrieved for the region that is currently pointed to. The decompression state is information that the "decompressor" (i.e., the process implementing the appropriate decompression algorithm and parameters for decompression) requires to decompress compressed data, such as the current pointer into the compression buffer for the current region, decode trees, etc., and is well known to those skilled in the art. The decompression state information for a region of compressed data is typically positioned at the beginning of the compressed region data so that the decompressor can immediately read the state and decompress the region data. In alternate embodiments, the decompression state can be referenced by pointers stored at the beginning of the region. For example, the pointers can point to a separately-stored table which lists the decompression state for that region. Structures and data used in compression/ decompression such as decode trees, encode trees, temporary data, etc. can be stored, for example, in RAM 39 local to ASIC 38 in the embodiment of FIG. 2a, or can be stored in the ASIC 38 in alternate embodiments.

When step 304 is implemented at the beginning (top left corner) of a region, i.e. the first occurrence of the region for any scan line on the page, the decompression state is read in for the first time and stored in a state buffer, implemented, for example, in ASIC 38 and/or RAM 39 (or 28). When the scan line pointer points to the same region on later (lower) scan lines, the decompression state for that region is read in from the state buffer. The height H1 and width W1 of the region (shown in FIG. 13a) is also read in; these dimensions are known from the region determination step 296 described above. In next step 306, the process decompresses the contiguous region data from the decompression buffer on the current scan line and outputs the decompressed region data to be displayed. An amount of compressed data corresponding to the width of the region is decompressed from the decompression buffer. When all the currently-contiguous region data on the current scan line is decompressed and the scan line pointer reaches the right border of the region, the process stops decompressing and displaying the region data. The process stores the location of the compressed band buffer where it stopped decompressing so that it will be able to start decompressing the same region data when the next scan line points to this region. The process preferably stores this location internally in registers of ASIC 38, but it can be stored in other memories as well.

In next step 308, the process checks if the scan line pointer is at the end of the current scan line at the right edge of the displayed page. If not, the process returns to step 298, where the process checks if the scan line pointer is pointing to another region, and background and region data is output accordingly as described above. When the pointer is at the end of the scan line, the process checks in step 310 if any region(s) have been completely decompressed and displayed ("completed"). This can be checked, for example, by determining whether any end-of-region information has been retrieved from the decompression buffer. If one or more regions have been completed, then, in step 312, a number of new region descriptors equal to the amount of completed regions are retrieved from the compressed band buffer and stored in the decompression buffer. By continuing with the process, new region descriptors are eventually added in from each successive band of data on the page (e.g., each band's region descriptors can be linked to the next band's region descriptors to effectively provide an entire page's worth of descriptors).

Note that when the scan line pointer reaches the end of a band, then potentially multiple regions will have been completed, since no region extends over a band border. The maximum number of regions that can be completed at the end of a band is the maximum number of allowed horizontal regions. Thus, the maximum number of allowed horizontal regions can be influenced by the amount of region descriptors that can be loaded at one time into the decompression buffer. Since it requires time to load additional region descriptors from the compressed band buffer to the decompression buffer, it is desirable that the decompression buffer be capable of holding at least one more region descriptor than this maximum number so a region can be decompressed while new region descriptors are being loaded.

If no regions have been completed in step 310, or after new compressed region descriptors have been loaded in step 3 12, then the process checks if the scan line pointer is at the end of the page. If not, the process returns to step 296, where the regions crossed by the next scan line (e.g., the scan line right under the previous scan line in the described embodiment) are determined. If the scan line pointer is at the end of the page, the process is complete at 314. The next page can then be decompressed and displayed, if desired, by returning to the start of the process at 290.

In an alternate embodiment, the process 46 of FIG. 13 can be implemented on a per band basis rather than a per page basis, such that step 314 would check for the end of a band. If the end of the band had been reached, the process could return to step 292 to retrieve region descriptors for the next band. In a different embodiment, an output display device may not need to output data in a scan line order. The compressed region data can be provided to the output device in other ways for such an embodiment.

The above-described limit to the number of regions which can be positioned on a single scan line can be dependent on the decompression process. For example, since a single scan line may intersect many regions, separate memory space needs to be allocated to store the decompression state of each region, the location in the compressed band buffer where decompression left off for each region, and the size of each region on the scan line (and any links to following regions, if a linked list of regions is being implemented). Memory space is also required for the decompression buffer. If available memory storage or ASIC registers are scarce, region information for only a limited number of regions can be stored due to these storage requirements when decompressing.

In an alternate embodiment, region data can be decompressed and stored to memory or a different storage device instead of being displayed. For example, the data of a page can be compressed efficiently using the different compression algorithms of the present invention and stored in a relatively small memory space. At a later time, a larger memory storage area may become available, and the compressed data can be decompressed to that memory instead of to an output display device. When decompressing to memory, the process of FIG. 13 can be used, if necessary, without the displaying steps. However, in the preferred embodiment, data is preferably decompressed to memory on a per band basis rather than a per page basis, and no scan line or scan line order is used. Each region can be entirely decompressed at a time to memory, and the decompression state does not have to be continually saved and retrieved each time a scan line intersects the region (as in, for example, steps 76 or 100 of FIGS. 4b and 4c). Likewise, the decompression of a particular region does not have to be continually interrupted depending on the path of a scan line. In addition, multiple decompression processes can be implemented simultaneously in the decompress-to-memory embodiment, since no sequential scan line display constraints apply.

Figure 13A:
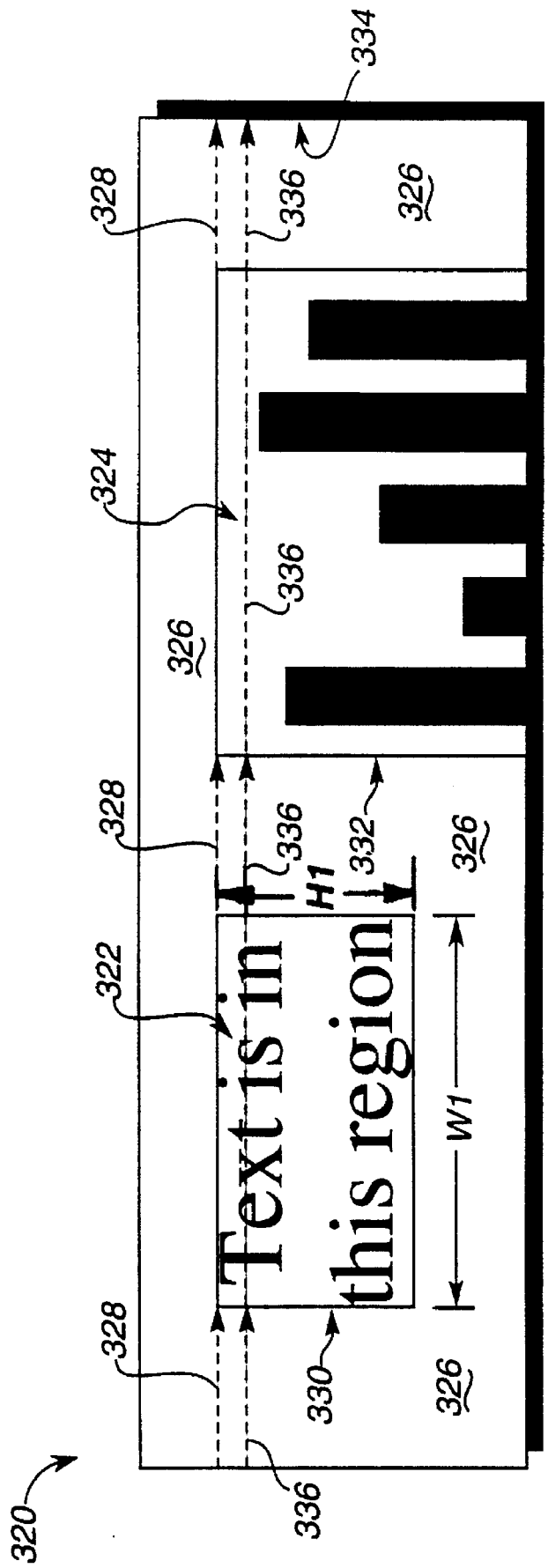
FIG. 13a is a diagrammatic illustration of a band and the scanning of the band to decompress data.

FIG. 13a is a diagrammatic illustration of the process of decompressing a band as described in FIG. 13. A band 320 of data includes two bitmap regions, 322 and 324. When displayed, these regions are positioned on a background area 326. A scan line 328 starts at the left edge of the band and background pixels are output until the left border 330 of region 322 is reached. The decompression state stored at the beginning of region 322 is read by the process from the decompression buffer and the state is stored in the state buffer. The size of the height H1 of the region is pixels is then read from the associated region descriptor so that the process will know when the decompression for the region is complete. The width W1 of the region in pixels is also read and this amount of region data in the compressed band buffer is decompressed and output. This moves the scan line pointer to the right edge of region 322, and the location in the decompression buffer where the decompression left off is stored, for example, in RAM 39 or ASIC 38 (this location can also be stored in RAM 28 or another storage location). The process then outputs more background data until the scan line pointer moves to the left border 332 of region 324. Since this is at the beginning of region 324 (i.e., the first time the data of the region has been pointed to by the scan line pointer), the decompression state for this region is stored in a different area of the state buffer. The compressed data of region 324 on the current scan line is then decompressed similarly to region 322. Once the scan line pointer reaches the right border 334 of the band, a new scan line 336 starts at the left border of the band just under the previous scan line. In FIG. 9a, scan line 336 is shown at an exaggerated distance under scan line 328 for clarity. Background data is output until the scan line pointer for scan line 336 reaches left border 330 of region 322. At this point, the process reads in the decompression state for this region from the state buffer, the size W1 of the region, and the location in the compressed band buffer where the decompression for region 322 left off on the previous scan line 328. The process then decompresses the data from the compressed band buffer for region 322. This process continues similarly for all regions of the page.

While this invention has been described in terms of several preferred embodiments, it is contemplated that alterations, modifications and permutations thereof will become apparent to those skilled in the art upon a reading of the specification and study of the drawings. For example, other types of objects besides text, graphics, and images can be defined and assigned their own types of compression algorithms that efficiently compress those types. In addition, other page description languages may inherently present objects in a display order so that the display lists described herein are not required. The mapping of objects to compression algorithms can also entail several possibilities; for instance, one or more types of objects can be compressed with many possible algorithms, and, correspondingly, one or more algorithms can be assigned to many possible types of objects. The constraints of the user ultimately determine the compression algorithms used, and these constraints can include time to compress/decompress or display the data; storage space available for the display lists, uncompressed band buffer, compressed band buffer, etc.; the quality of the resulting displayed visual representation that is derived from the objects; and other factors, such as overall page characteristics, hardware/software limitations, etc.

Furthermore, certain terminology has been used for the purposes of descriptive clarity, and not to limit the present invention. It is therefore intended that the following appended claims include all such alterations, modifications and permutations as fall within the true spirit and scope of the present invention.

What is claimed is:

1. A data processing system with selective object compression and decompression for processing data objects, comprising:

a rasterizer that converts data objects into bitmap objects;

means for dividing said bitmapped objects into non-intersecting regions, each of said regions having a type;

a compressor that compresses said regions with selected compression mechanisms chosen from a set of compression mechanisms to produce compressed bitmap object regions, where said type of said bitmap object region is used to select a compression mechanism for a particular bitmap object region, said compressor storing said compressed bitmap object regions in a memory; and a decompressor that selectively decompresses said compressed bitmap object regions with selected decompression mechanisms chosen from a set of decompression mechanisms to produce uncompressed bitmap object regions, where the selection of a decompression mechanism for a particular compressed bitmap object region is dependent upon said selected compression mechanism for said particular compressed bitmap object region.

2. A data processing system as recited in claim 1 wherein said compressor and decompressor are implemented in an output device.

3. A data processing system as recited in claim 1 further including an output device for displaying uncompressed bitmapped objects received from said decompressor, said output device is one of the group consisting of a printer device and a screen display.

4. A data processing system as recited in claim 3 wherein said data objects are organized into at least one page where each said at least one page is organized into a plurality of bands, said bands having a display order on said page, wherein data objects on said page are displayed by said output device in said display order and where each of said non-overlapping regions associated with a data object spans only a single band.

5. A data processing system as recited in claim 4 wherein said data objects are stored in display lists, wherein a display list is provided for each band of said page.

6. A digital output processing system as recited in claim 1 wherein said types include text, graphics, and image types.

7. A data processing system as recited in claim 1 wherein each of said regions has a type, and wherein a region type is derived from all the types of the bitmap objects intersected by said region.

8. A data processing apparatus as recited in claim 1 wherein a region type for a particular region may be different from the type of bitmap object from which said region was derived.

9. A data processing system as recited in claim 4 wherein said decompressor further includes means for determining where an output scan line intersects compressed regions of a band, said decompressor decompressing said compressed regions where said scan line intersects said regions.

10. A data processing system as recited in claim 9 wherein said decompressor further includes means for outputting background data to said output device when where said scan line does not intersect a region including one or more bitmap objects.

11. A method for providing a digital output with selective object compression and decompression comprising:

receiving a page of output data including one or more objects, each object including type and location information respectively characterizing the type of the data from a predetermined plurality of data types and a location of said object on said page;

storing said type and location information for said objects in a display list indexed according to said location information;

compressing each of said objects with a selected compression algorithm chosen from a set of compression algorithms to produce compressed object data of said type, where said type information is used to select a compression algorithm for said compressed object data;

storing said compressed object data in a memory coupled to an output device;

when said page of data is to be displayed, identifying a first object to be displayed from said display list;

decompressing said compressed object data with a selected decompression algorithm chosen from a set of decompression algorithms to produce uncompressed output data, where said type information is used to select a decompression algorithm;

supplying output data associated with the object to be displayed to said output device;

identifying a next object to be displayed from said data stored in said display list; and repeating the steps of decompressing the compressed object data, supplying output data and identifying a next object until all said objects in said page of output data have been supplied to said output device.

12. A method as recited in claim 11 further comprising the steps of:

dividing said page of output data into bands, and storing type and location information for each object within a band in an associated band display list; and rasterizing one or more objects of said band display list as bitmap objects of an uncompressed band and storing the resultant uncompressed band objects in an uncompressed band buffer, wherein each bitmap object has a type corresponding to said type of said object from which was rasterized.

13. A method as recited in claim 12 wherein said step of compressing said object data includes compressing said uncompressed band objects into compressed band objects and said step of storing said compressed object data includes storing said compressed band objects in a compressed band buffer of a memory.

14. A method as recited in claim 13 wherein said step of compressing said output data includes selecting a set of compression algorithms which meet compression constraints.

15. A method as recited in claim 13 wherein said steps of decompressing said compressed object data and supplying said data to said output device includes decompressing said compressed band objects and supplying decompressed band objects to said output device.

16. A method as recited in claim 15 wherein said step of compressing said uncompressed band objects includes checking when said uncompressed band objects fit in said compressed band buffer when compressed, and, when said uncompressed band objects do not fit, decompressing and recompressing compressed band objects that were previously compressed.

17. A method as recited in claim 12 further comprising a step of combining said objects into a single object when a cost of combining said objects is under a predetermined threshold, said cost determined by the separation between the objects.

18. A method as recited in claim 17 wherein said cost of combining is determined by the amount of background data that is included in a combined resulting object compared to the amount of data included in said objects that were to be combined.

19. A method as recited in claim 17 further comprising a step of forcing combinations of objects to free memory storage in said compressed band buffer.

20. A method as recited in claim 12 wherein if during the step of compressing said uncompressed band objects a number of objects compressed for a given band exceeds a predetermined number, then multiple objects are combined into a single object prior to compression to reduce the number of objects actually compressed for a given band.

21. A method for compressing and decompressing a page of bitmapped data, organized into a plurality of bands to be displayed by an output display device, comprising;

(a) receiving one of the bands that includes one or more regions, each region having at least one type;

(b) using a type of each region to select a compression method for each of said regions from a plurality of available compression methods;

(c) compressing each of said regions of said band according to its selected compression methods to create a compressed band;

(d) storing said compressed band in a compressed band buffer; and (e) decompressing said compressed band in said compressed band buffer and sending said decompressed band to said output display device for display.

22. A method as recited in claim 21 wherein said step of receiving a band of data includes storing said band of data in an uncompressed band buffer, said uncompressed band buffer being able to store at least one band of data.

23. A method as recited in claim 22 where said regions include one or more input objects having type and location information, and said receiving step further includes organizing and storing said input objects into a plurality of display lists, where each display list corresponds to one of said bands of said page and at least one display list includes said input objects, and rasterizing said objects of one of said display lists into said uncompressed band buffer.

24. A method as recited in claim 23 wherein said steps of rasterizing said objects of a display list and compressing said rasterized objects occurs before all of said input objects are included in said display lists, wherein said rasterizing and compressing step is accomplished to free display list storage when display list storage is not available.

25. A method as recited in claim 23 further comprising a step of dividing said regions into subregions consisting of non-intersecting rectangles each of which subregions includes one or more objects of the same type.

26. A method as recited in claim 21 further comprising the step of repeating the steps of receiving a band of data, selecting a compression method, compression said regions and storing said compressed band for each band in said page, and repeating the step of decompressing said compressed band in display order for each band in said page to be displayed.

27. A method as recited in claim 25 wherein said subregions are characterized as empty regions if they do not contain an object or non-empty if they contain one or more objects, and where adjacent non-empty subregions are combined into a single subregion before compressing said subregions if all the objects contained in the adjacent subregions are of the same type.

28. A method as recited in claim 22 wherein a compression method is selected only for said non-empty subregions and where only said non-empty subregions are compressed in said compressing step.

29. A method as recited in claim 21 wherein said step of selecting a compression method includes using pre-defined constraints to select said compression method, said pre-defined constraints including an estimated compression ratio achieved when compressing said region and the visual quality of said region when displayed after said region is compressed.

30. A method as recited in claim 21 wherein said step of storing said compressed band in said compressed band buffer includes checking when said compressed band fits in said compressed band buffer and recompressing previously compressed bands, when necessary, to fit said compressed band in said compressed band buffer.

31. A method as recited in claim 30 wherein said regions of said band are compressed at a compression level, and wherein said step of storing said compressed band in said compressed band buffer includes selecting a new compression level, and decompressing and recompressing all previously compressed bands at a new compression level before compressing said compressed band at said new compression level.

32. A method as recited in claim 21 wherein said step of sending said decompressed band to said output display includes outputting background display data for portions of said page not covered by said compressed regions.

33. A method as recited in claim 32 wherein said step of sending said decompressed bands to said output display includes determining where an output scan line intersects said regions of a band such that said compressed regions are decompressed when said scan line intersects said regions.

34. A system for compressing and decompressing data comprising:
a memory;
means for storing received data including a plurality of display lists, said received data including one or more objects each having a type, said objects organized into at least one page, said page organized into a plurality of bands, wherein a display list is provided for each band of said page;
means for identifying a band of data for processing including means for storing objects from a display list associated with said identified band in an uncompressed band buffer included in said memory;
means for partitioning said objects into non-overlapping regions and storing said regions in a region buffer included in said memory, each of said regions that include objects characterized by a type selected from one of the types of one of the objects that said region covers;
means for compressing said regions using said type of each of said regions to select a compression method from a plurality of compression method from a plurality of compression methods and storing said compressed regions in a compressed band buffer included in said memory;
means for decompressing said regions using said type of each of said regions to select a decompression method from a plurality of decompression methods and storing said decompressed regions in said compressed band buffer; and
an output display device for receiving decompressed data from said means for decompressing and displaying said decompressed data.

35. A system as recited in claim 34 further comprising means for rasterizing at least some of said objects from said display list into said uncompressed band buffer.

36. A system as recited in claim 34 wherein said means for partitioning said objects includes storing coordinates of objects in arrays in said memory and assigning regions to areas of said band between said coordinates.

37. A system as recited in claim 34 wherein said regions are characterized as either empty regions covering no objects, or as non-empty regions covering objects, said system further including means for combining adjacent non-empty regions into a single region.

38. A system as recited in claim 37 wherein said means for combining combines non-empty regions having the same selected compression algorithm into a single region.

39. A digital output processing system as recited in claim 37 wherein said means for combining combines non-empty regions having the same type and any empty regions disposed between said non-empty regions into a single region when there is insufficient space in said compressed band buffer to store an entire band of data.

40. A system as recited in claim 37 wherein said means for compressing only compresses non-empty regions.

41. A system as recited in claim 34 wherein said means for decompressing means further includes means for outputting background data to said output display device when compressed region data is not being displayed.

42. A system for processing data objects each representing display data for a display area and each having a data type and a location in the display area, comprising:
a divider for dividing the display area into a plurality of non-overlapping non-empty regions, where each region contains all or part of at least one data object and each region has a location and a region type derived from the data types of the object data in the region;
a plurality of compression mechanisms and decompression mechanisms, where each compression mechanism has an associated decompression mechanism;
a compressor that selects one of the compression mechanisms for each of the non-empty regions according to its region type and then uses the selected compression mechanism to compress those portions of the object data found in the region, thereby producing compressed object data;

a memory coupled to the compressor for storing compressed object data;

a decompressor coupled to the memory that decompresses compressed object data to produce uncompressed object data by applying to each compressed object data a decompression mechanism associated with the compression mechanism used to create the compressed object data; and a monitor coupled to the compressor, decompressor, and memory for detecting when the memory is becoming full and triggering the decompression of previously compressed object data and the recompression thereof to free up space in the memory.

43. The system of claim 42 further comprising an object data combiner for combining one or more regions of uncompressed object data into a single region of uncompressed object data, where:

the object data combiner is invoked when the monitor has detected the memory is becoming full; and the object combiner combines the uncompressed object data associated with each region according to predefined criteria, the uncompressed object data for the combined region to be recompressed by the compressor resulting in the freeing up of space in the memory.

44. The system of claim 43 wherein the object data combiner combines regions of uncompressed object data into a single combined region when a cost of combining the objects, determined by the separation between the regions, is under a predetermined threshold.

45. The system of claim 44 wherein the cost of combining is determined by the amount of background data that is included in a combined resulting region compared to the amount of object data included in the regions that were to be combined.

46. The system of claim 42 wherein the predefined criteria include combining adjacent regions that are of the same type and combining non-adjacent regions that are of the same type if the space separating the non-adjacent regions does not contain any object data.

47. The system of claim 42 further comprising a display engine coupled to receive uncompressed object data from the decompressor.

48. The system of claim 47 where the display engine is one of the group consisting of a laser printer engine, a plotter, and a CRT.

49. The system of claim 42 further comprising an embedded computer comprising:

a computer processor, and a program memory coupled to the computer processor; and a display engine coupled to receive uncompressed object data from the decompressor;

where the display engine is coupled to the embedded computer; and the compressor and decompressor are implemented as computer program instructions tangibly stored in the program memory.

50. The system of claim 42 further comprising:

means coupled to the decompressor for displaying the uncompressed object data; and means for updating a pointer to indicate a next portion of a display area to display such that when the pointer intersects a non-empty region the decompressor decompresses and outputs the compressed data associated with the non-empty region and when the pointer does not intersect a non-empty region the decompressor outputs background data.

51. A system for processing data objects each representing display data for a page and each having a data type and a location on the page, where the page is divided into bands, the system comprising:

a memory;

a display list in the memory for each band of the page for storing those portions of the object data found in the band;

a divider coupled to the display list memory for dividing the object data in each band into a plurality of non-overlapping non-empty regions where each region contains all or part of at least one data object and each region has a location and a region type derived from the data types of the object data in the region;

a plurality of compression mechanisms and decompression mechanisms, where each compression mechanism has an associated decompression mechanism;

a compressor that selects one of the compression mechanisms for each of the non-empty regions according to the corresponding region type, uses the selected compression mechanism to compress the object data found in the region, thereby producing compressed object data, and stores compressed object data in the memory;

a decompressor coupled to the memory that decompresses compressed object data to produce uncompressed object data by applying to the compressed object data a decompression mechanism associated with the compression mechanism used to create the compressed object data; and a monitor coupled to the compressor, decompressor, and memory for detecting when the memory is becoming full and triggering the decompression of previously compressed object data and the recompression thereof to free up space in the memory.

52. The system of claim 51 further comprising:

a rasterizer coupled to the display list memory to rasterize the data objects to produce bitmaps stored in the non-empty regions; and a raster output device display engine coupled to receive uncompressed object data;

where the compression mechanisms operate on bitmaps to produce compressed bitmap object data; and the decompression mechanisms operate on compressed bitmap object data to produce uncompressed bitmap object data for the raster output device display engine.

53. The system of claim 52 further comprising:

means for updating a pointer to indicate a next portion of a band to output to the raster output device such that when the pointer intersects a non-empty region the decompressor decompresses the compressed data associated with the non-empty region and outputs it, and when the pointer does not intersect a non-empty region the decompressor outputs background data.

54. A method for processing data objects each representing display data for a display area and having a data type and a location in the display area, the method comprising the steps of:

(a) receiving the data objects;

(b) storing the data objects in a display list associated with the display area;

(c) dividing the display area into a plurality of non-overlapping non-empty regions, each region including one or more data objects or portions of data objects and each region having a location and a region type derived from the data types of the data objects and portions of data objects in the region;

(d) providing a plurality of compression mechanisms and decompression mechanisms, where each compression mechanism has an associated decompression mechanism;

(e) compressing the object data in each non-empty region by selecting one of the compression mechanisms according to the corresponding region type and compressing the object data, thereby producing compressed object data;

(f) storing the compressed object data in a memory;

(g) decompressing the compressed object data by selecting a decompression mechanism associated with the compression mechanism used to create the compressed object data and decompressing the compressed object data to produce uncompressed object data; and, (h) monitoring to detect when the memory is becoming full and triggering the decompression of previously compressed object data and the recompression thereof to free up space in the memory.

55. The method of claim 54 further comprising the steps of:

combining a plurality of regions of uncompressed object data into a combined region of object data when the memory is becoming full; and compressing the object data in the resulting combined region to free up space in the memory.

56. The method of claim 55 wherein regions are combined when a cost of combining the objects, determined by the separation between the regions, is under a predetermined threshold.

57. The method of claim 56 wherein the cost of combining is determined by the amount of background data that is included in a combined resulting region as compared to the amount of object data included in the regions that were to be combined.

58. A method for processing data objects each representing display data for a display area and having a data type and a location in the display area, the method comprising the steps of:

receiving the data objects;

establishing in the display area a plurality of non-overlapping bands;

dividing any data objects that span more than one band into multiple data objects that are each located in only one band;

establishing for each band a display list associated with the band;

storing the data objects located in a band in the display list associated with the band;

dividing each band into a plurality of non-overlapping non-empty regions each having a location and a region type derived from the data types of the data objects in the region;

providing a plurality of compression mechanisms and decompression mechanisms, where each compression mechanism has an associated decompression mechanism;

compressing a first band of data objects by selecting one of the compression mechanisms for each non-empty region in the first band according to the corresponding region type and using the selected compression mechanism to compress the data objects in the region, thereby producing compressed data objects;

storing the compressed data objects in a memory;

compressing and storing the remaining bands in the display area by applying to them the preceding two steps, respectively;

decompressing each band of compressed data objects by selecting for each compressed data object a decompression mechanism associated with the compression mechanism used to create the compressed data object and decompressing it to produce an uncompressed data object; and monitoring to detect when the memory is becoming full and triggering the decompression of previously compressed data objects and the recompression thereof to free up space in the memory.

59. The method of claim 58 further comprising the steps of:

sending the uncompressed data objects to an output display; and determining where an output scan line intersects the regions of a band such that the compressed regions are decompressed when the scan line intersects the regions.

60. The method of claim 58 further comprising the step of:

sending the uncompressed data objects to an output display; and outputting background display data for portions of the page not covered by uncompressed data objects.

* * * * *